United States Patent [19]

Razdan et al.

[11] Patent Number: 5,550,760
[45] Date of Patent: Aug. 27, 1996

[54] SIMULATION OF CIRCUITS

[75] Inventors: Rahul Razdan, Princeton; Gabriel Bischoff, Marlborough; Ernst G. Ulrich, Bedford, all of Mass.

[73] Assignee: Digital Equipment Corporation, Maynard, Mass.

[21] Appl. No.: 139,228

[22] Filed: Oct. 19, 1993

Related U.S. Application Data

[63] Continuation of Ser. No. 19,211, Feb. 18, 1993, abandoned.
[51] Int. Cl.$^6$ .................................................. G06F 15/60
[52] U.S. Cl. ............................................................ 364/578
[58] Field of Search .................................. 364/578, 488, 364/489, 490; 371/23, 28; 395/375, 500, 650

[56] References Cited

U.S. PATENT DOCUMENTS

| | | | |
|---|---|---|---|
| 4,493,045 | 1/1985 | Hughes, Jr. ........................ | 364/488 |
| 4,736,338 | 4/1988 | Saxe et al. ........................ | 364/578 |
| 4,833,619 | 5/1989 | Shimizu et al. ................... | 364/489 |
| 5,181,179 | 1/1993 | Fang et al. ........................ | 364/488 |

OTHER PUBLICATIONS

Ulrich et al;"Concurrent Min–Max Simulation"; IEEE Conference on Design Automation; 2/25–28/1991.
Razdan et al;"Exploration of Periodicity in Logic Simulation of Synchronous Circuits"; IEEE Conference on CAE; 11/11–15/1990.

Primary Examiner—Ellis B. Ramirez
Attorney, Agent, or Firm—Denis G. Maloney; Arthur W. Fisher

[57] ABSTRACT

Computational requirements are reduced for executing simulation code for a logic circuit design having at least some elements which are synchronously clocked by multiple phase clock signals, the simulation code including data structures associated with circuit modules and nodes interconnecting the circuit modules. The simulation code is preanalyzed and phase waveforms are stored each representing values occurring at a node in successive phases. Based on the preanalysis, modules are categorized in a first category, for which an event-based evaluation is to be performed in each phase of the simulation, and a second category for which no event-based evaluation need be performed in at least one but not all phases. For each phase of a second category module, an appropriate response to an event occurring with respect to the module is determined. A data structure is then included in the simulation code, having an entry for each module of the code for controlling the phases in which simulation code for evaluation of the module is not executed.

8 Claims, 21 Drawing Sheets

IN ARRAY

PS ARRAY

NODE N, EVALUATION FUNCTION
        .
        .
        .

CS ARRAY

NODE M, EVALUATION FUNCTION
        .
        .
        .

PI ARRAY

DI ARRAY

INPUT P
        .
        .

CLK ARRAY

CLOCK R
        .
        .

*FIGURE 8*

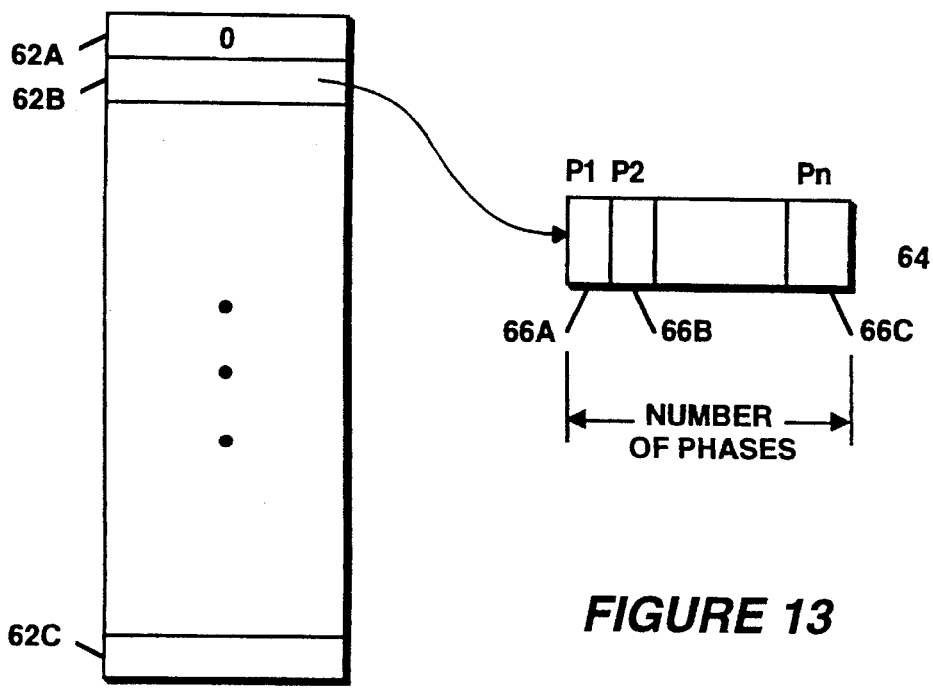
FIGURE 13
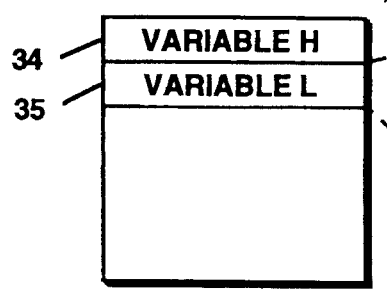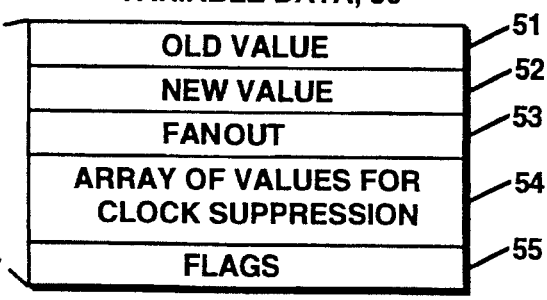
FIGURE 14

```
/* nand from LGC file nand.lgc

*generated by COSMOS LGCC $Versions$ on */
#define LGCCOUT
#define NUM_SUFS (2)
#include (stdio.h)
#include "types.h"
#include "fault.h"
#include "lgccout.h"

int tsc_2282430499_t_=0;
sc_2282430499( 0, i, z)
      conns_ptr 0, i, z' /*  4 units, 0 zeroes, 2 outs 0 nodes */
{         register anon *a= updTempArea;
   LOC_DECL
   AND3(NO(0) ,OI(3),OI(1));
   OR3(NO(1),OI(2),OI(0));

}
mInst_no fo0[] ={ END,
          END
          END };
foStruct fos[] = {
          { NULL } };
mInst_no fol[] = { END,
          0, END
          END };
foStruct fos1[]= {
          { FALSE, 7fol[1] },
          { NULL } };

node_t nd[] =
{         {V_I (NULL,NULL) ,V_I(NULL,NULL) ,0, "OUT")
          {V_I (&fos1[0] ,NULL, V_I(&fos1[0],NULL),-1,"A"},
          {V_I (&fos1[0] ,NULL, V_I(&fos1[0],NULL),-1,"B"},
          NULL

};
NODE COUNT (3)

node_no v1[]= { NULL };
stVector st_vecs[] =
{         { NULL, * *}
};
unsigned int num_st_vecs = 0;

conn cv1[]= {
          &nd[0].L, &nd[0] .H, NULL,
          &nd[1].L, &nd[2] .H, &nd[2].I, &nd[2] .H,
               NULL,
          NULL,
          NULL };

mInst mods[] =
{         MI_I(tsc_2282430499_t_,  sc_2282430499, &cv1[0], &
cv1[3], &cv1[8], 0, "sc
_2282430499/0/"0,
          NULL };
     MOD_COUNT(1)
unsigned int rank_origins []=
{        0
};
RANK_COUNT (1);
```

FIGURE 15

SIMULATION OF CIRCUITS

BACKGROUND OF THE INVENTION

This is a continuation of U.S. patent application Ser. No. 08/019,211 (Abandoned) filed on Feb. 18, 1993.

This invention relates to simulation of circuits.

Referring to FIG. 1, in general, a circuit 8 of the synchronous kind may be characterized as including a state array 10, combinational logic 12, synchronizers (clocks) 14, and primary inputs 16.

The state array includes memory elements such as latches (dynamic and static) or flip-flops. The combinational logic maps the previous states of the memory elements and the primary inputs to a next state for the state array. The synchronizers control the latching of the memory elements; they are periodic waveforms whose periods are chosen based on delays which occur in propagation of signals in the combinational logic/state array loop.

The correctness of complex circuit designs is typically tested by logic simulation. The input to logic simulation is a netlist of transistors or gates and interconnections among them that together form the state array, combinational logic, and synchronizer generator.

Simulation of a synchronous circuit typically involves substantial wasted computational effort associated with the highly buffered distribution network (not shown in FIG. 1) which carries the clocks to the synchronizers to reception points in the state array. For complex circuits, the distribution network may be large.

In a conventional event-driven simulation, the distribution network is evaluated every cycle because clock change events occur in every cycle. The clock reception points (latches and flip-flops) also are evaluated every cycle, even if the data input has not changed. Both kinds of events are futile because re-evaluation will not add any new information to the simulation.

Up to 90% of the CPU time for simulation may be consumed by the event activity generated by the synchronizers. Futile activity is especially high in MOS circuits that use precharge/discharge circuit design techniques. Highly pipelined designs with faster clock speeds also tend to increase the futile activity ratio in simulation.

Another factor in the performance of conventional logic simulators arises in modeling non-logic effects, such as timing characteristics (inertial delay, transport delay, rise/fall delay).

A typical strategy for logic simulation is to simulate the design under as many logical cross-product cases as possible before the product is brought to market. Logical cross-products are the different conditions under which a circuit must function. For example, with a microprocessor, a logical cross-product might be the correct evaluation of an ADD operation in the presence of various memory management interrupts. Any improvement in simulation performance directly improves the chances of finding logical bugs in the design.

One general approach to improving simulation performance is based on clock suppression which is directed to reducing the number of futile events. Other proposed clock suppression techniques have been interconnect-based or state-based. In interconnect-based schemes proposed by Ulrich, the clock lines are temporarily disconnected from the sequential elements and the lines are reconnected according to events on the data inputs. (Ulrich, "A Design Verification Methodology Based on Concurrent Simulation and Clock Suppression," Design Automation Conference, pp 709–712, Florida, June 1983, Ulrich and Hebert; "Speed and Accuracy in Digital Network Simulation Based on Structural Modeling", Design Automation Conference, pp 587–593, Nevada, June 1982; and Ulrich et al. in "Design Verification for Very Large Digital Networks Based on Concurrent Simulation and Clock Suppression", Proc. Intl. Conf. on CAD, pp. 277–280, New York, November, 1983). Later, a version of this approach was implemented in the Dr. Creator simulator.

Interconnect-based approaches are simple but work only with clock signals, not with activity generated by data-dependent periodic signals. Precharge circuit design is difficult for interconnect-based approaches.

The state-based approach has been advocated by Takamine et al. ("Clock Event Suppression Algorithm of VELVET and its Application to S-820 Development", in 25th ACM/IEEE Design Automation Conference, pp. 716–719, 1988) and Weber and Somenzi ("Periodic Signal Suppression in a Concurrent Fault Simulator", in The European Conference on Design Automation, Amsterdam, February 1991). The state-based approach contains a new state, P, for the simulator in addition to the usual states {0,1,X}. Weber has modified the Dr. Creator simulator such that the new state, P, contains temporal information about the clock signal, such as its period and skew. In addition, function tables are defined for all basic primitives (gates) understood by the simulator. These function tables describe the effect of the new state, P, on the output. Takamine, in VELVET, assumes that the new state is a synchronizer and maintains no timing information associated with the clock state. VELVET also describes function tables for the clock state for the basic simulation primitives.

The state-based approach advocated by Weber addressed the problem of data-dependent periodic signals, but includes timing information that leads to timing calculations that are redundant in the context of a synchronous circuit. In addition, feedback can cause harmonics, which have to be filtered by an observer at the sequential elements. For fault simulation, the intended application for Weber's tool, the observer can be quite complex because an effective evaluation is expensive (due to the fault effects). But, for conventional, good machine simulation, the observer must be very simple to balance out the inexpensive evaluation of simple gates.

By not maintaining timing information, VELVET avoids many of these timing related problems. Both state-based approaches require new function tables for the basic gates in the simulator. To handle more complex combinational functions, such as those generated by a symbolic analyzer such as ANAMOS (R. E. Bryant, "Boolean Analysis of MOS Circuits," IEEE Trans. on CAD of Integrated Circuits and Systems CAD-6, 4(1987), pp. 634–649), the combinational functions must be broken down into small gates and simulated individually.

In synchronous circuit design, timing verification can be improved by static timing verification techniques such as those described by Pan et al. in "Timing Verification on a 1.2M-Device Full-Custom CMOS Design," 28th Design Automation Conference, 1991, pp. 551–554, and by Grodstein et al in "Race Detection for Two Phase Systems," Proc. IEEE International Conference on CAD, November 1990, pp. 20–33. Static timing verifiers check timing constraints for all possible input patterns, while conventional dynamic logic simulators can only verify timing constraints on a given pattern sequence. The static check of non-logic effects can be extended to electrical effects such as capacitive coupling as described by Grundmann and Yen in "XREF/COUPLING: Capacitive Coupling Error Checker," Proc. IEEE International Conference on CAD, November 1990, pp. 244–247, and dynamic node timeout as described by Brichoff and Razdan, "Static Charge Decay Analysis of MOS Circuits," in Custom Integrated Circuits Conference, 1991.

SUMMARY OF THE INVENTION

In general, in one aspect, the invention features a method (and corresponding apparatus) of reducing computational requirements for executing simulation code for a logic circuit design having at least some elements which are synchronously clocked by multiple phase clock signals, the simulation code including data structures associated with circuit modules and nodes interconnecting the circuit modules. The simulation code is preanalyzed and phase waveforms are stored each representing values occurring at a node in successive phases. Based on the preanalysis, modules are categorized in a first category, for which an event-based evaluation is to be performed in each phase of the simulation, and a second category for which no event-based evaluation need be performed in at least one but not all phases. For each phase of a second category module, an appropriate response to an event occurring with respect to the module is determined. A data structure is then included in the simulation code, having an entry for each module of the code for controlling the phases in which simulation code for evaluation of the module is not executed.

Embodiments of the invention include the following features. The entry includes either an indication that the module belongs to the first category, or, with respect to a module of the second category, phase waveform information associated with the module.

In general, in another aspect, the invention features a method (and corresponding apparatus) of reducing computational requirements for executing simulation code for a logic circuit design having at least some elements which are synchronously clocked by multiple phase clock signals, the simulation code including data structures associated with circuit modules and nodes interconnecting the circuit modules, the simulation code also including process steps which schedule modules for evaluation in response to events which occur during the simulation. In the process of scheduling modules for evaluation, for each output variable of a module under evaluation for a phase, if its old state is the same as its new state, a test is performed of whether the old state of the output variable is different from a corresponding stored output value, and, if so, clock events are scheduled for later phase evaluations of the module.

In general, in another aspect, the invention features a method of reducing computational requirements for executing simulation code for a logic circuit design having at least some elements which are synchronously clocked by multiple phase clock signals, the simulation code including data structures associated with circuit modules and nodes interconnecting the circuit modules, each module having a fanout leading from its outputs to inputs of other modules, the simulation code also including process steps which apply a fanout of a module under evaluation in a phase to the scheduling of future evaluations of modules. In the process of applying a fanout to the scheduling of future evaluations, if the output of the module in the phase is already known, the scheduling of future evaluations is suppressed with respect to that output.

Embodiments of the invention include the following features. The fanout is applied with respect to scheduling of evaluations with a unit delay, and the scheduling of future evaluations is suppressed with respect to evaluations with a unit delay. The fanout is applied with respect to scheduling of evaluations with a zero delay, and the scheduling of future evaluations is suppressed with respect to evaluations with a zero delay.

In general, in another aspect, the invention features a method of reducing computational requirements for executing simulation code for a logic circuit design having at least some elements which are synchronously clocked by multiple phase clock signals, the logic design being subject to resistive conflicts and to charge sharing, the simulation code including data structures associated with circuit modules and nodes interconnecting the circuit modules. A three-state version of simulation code is generated for the circuit design, the three states corresponding to states 0, 1, or X, where X represents an undefined state. A preanalysis was performed of the three-state version and phase waveforms are stored each representing values occurring at a node of the code. For each phase of a module for which no event-based evaluation need be performed, an appropriate response to an event occurring with respect to the module of the three-state version is determined and stored. A two-state version of simulation code for the circuit design, the two states corresponding to 0, and 1 is generated. For each phase of a module for which no event-based evaluation need be performed, the stored response with respect to corresponding module of the three-state version is determined and stored.

Embodiments of the invention include the following features. The step of generating a two-state version comprises converting to a logical 1 or 0, any X that appears in a fanout, and generating a fourth state with respect to a node for levels of resistive strength less than or equal to the resistive strength corresponding to capacitive strength. During execution of the two-state version, if a fourth state is encountered at the output of a module, the old state is reassigned to the output.

The exploitation of periodicity in logic simulation of synchronous circuits significantly increases the performance (by five or ten times) of switch-level synchronous circuit simulators.

Other advantages and features will become apparent from the following description and from the claims.

DESCRIPTION

We first briefly describe the drawings.

FIG. 8 is a formal description of a synchronous circuit model.

FIGS. 13 and 14 are data structure diagrams for module evaluation array and SCS node array elements, respectively.

FIG. 15 is an example of output from SCS.

NETLIST CIRCUIT MODEL

Preliminarily we discuss the unit-delay switch-level simulator, COSMOS (described by Bryant et al., "COSMOS: a Compiled Simulator for MOS circuits," 24th Designed Automation Conference, 1987, pp. 9–16). COSMOS models switch-level effects of charge sharing and resistive conflict that relate to correct logical operation.

Figure 2:
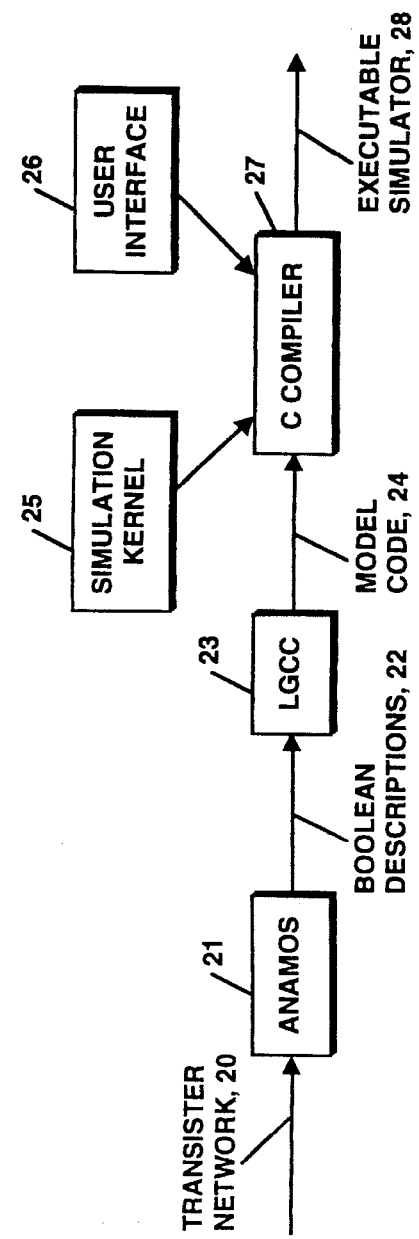
FIG. 2 is a block diagram of the COSMOS logic simulator.

In its original form, COSMOS consists of a set of C language programs configured as shown in FIG. 2. Symbolic analyzer, ANAMOS 21, receives a switch-level representation of a MOS circuit 20 (a netlist of transistors) and partitions it into a set of channel-connected subnetworks. It then derives a boolean description 22 of the behavior of each subnetwork. A second program, LGCC 23, translates boolean representation 22 into model code 24, a netlist of evaluation functions in the form of a set of C language evaluation procedures plus declarations of data structures describing the network interconnections. Finally, model code 24 produced by LGCC 23, together with simulation kernel 25 and user interface code 26, are compiled by C compiler 27 to generate executable simulator code 28. Simulator 28 implements a block-level, event-driven scheduler, with blocks corresponding to the subnetworks. Processing an event at a subnetwork involves calling the appropriate evaluation procedure for that subnetwork to compute the new state and output of the block.

Each procedure generated by LGCC 23 requires two arguments, which are pointers to access the formal parameters of the original description module 20. The only operations required in a procedure are pointer dereferencing, array indexing, assignment, and boolean operations.

A logic input to ANAMOS 21 may have any of four types of elements:

Node: An electrical node acting as either a signal source (input) to the circuit or a capacitor that can store charge dynamically.

Transistor: An MOS transistor acting as a switch that can connect its source and drain terminals depending on the state of its gate terminal.

Block: A circuit module with input-output behavior described by a C language procedure.

Vector: A collection of nodes grouped together for convenient manipulation or observation in the simulator.

ANAMOS 21, followed by code generator LGCC 23, transforms the inputs representing the circuit into a set of a modules connected by simple (i.e., non charge-storing) nodes. Each module of model code 24 corresponds to either a functional block or a transistor subcircuit. A module has behavior specified by an evaluation procedure, either supplied by the user (i.e., functional blocks) or automatically generated (i.e., transistor subcircuits). The complexities of the switch-level node and transistor model are fully characterized by the analysis.

NODE MODEL

The state of a node in the model code 24 is represented by one of three logic values:

| 0 | low |
| 1 | high |
| X | invalid (between 0 and 1), or uninitialized |

The additional states used in other logic simulators (e.g., high impedance) are not required, because their behavior is captured by the network model. Similarly, there is no need to encode signal strength (e.g., charged, weak, or strong) as part of the node state, because strength effects are captured by the symbolic analysis algorithm.

Two types of nodes are allowed:

Input: Provide strong signals from sources external to the network (e.g., power, ground, clock, and data inputs). Power and ground nodes are treated as having fixed logic values.

Storage: Have states determined by the operation of the network and can (usually) retain these states in the absence of applied signals.

Each storage node is assigned a size in the set $\{0, \ldots, \text{maxnode}\}$ to indicate (in a simplified way) its capacitance relative to other nodes with which it may share charge. When a set of connected storage nodes is isolated from any input nodes, they are charged to a logic state dependent only on the state(s) of the largest node(s). Thus the value on a larger node will always override the value on a smaller one. Many networks do not depend on charge sharing for their logical behavior and hence can be simulated with only one node size (maxnode=1). In general, at most two node sizes (maxnode=2) will suffice with high capacitance nodes (e.g., pre-charged busses) assigned size 2 and all others assigned size 1.

A node size of 0 indicates that the node cannot retain stored charge. Whenever such a node is isolated, its state becomes X. This size is useful when modeling static circuits. By assigning size 0 to all storage nodes, the simulation is more efficient, and unintended uses of dynamic memory can be detected.

Symbolic analyzer ANAMOS 21 attempts to identify and eliminate storage nodes that serve only as interconnections between transistor sources and drains in the circuit. It retains any node that it considers "interesting," i.e., those nodes whose state affects circuit operation. Interesting nodes include those that act as the gates of transistors, as inputs to functional blocks, or as sources of stored charge to other interesting nodes. Sometimes a node whose state is not critical to circuit operation, however, may be of interest to the simulator user. The user must take steps to prevent ANAMOS from eliminating these nodes, by identifying them as "visible". A node can be so identified with a command-line option to COSMOS.

TRANSISTOR MODEL

A transistor is a three terminal device with node connections of gate, source, and drain. Normally, there is no distinction between source and drain connections—the transistor is a symmetric, bidirectional device. However, transistors can be specified to operate unidirectionally to overcome limitations of the network model. That is, a transistor can be forced to pass information only from its source to its drain, or vice-versa. Unidirectional transistors are required only rarely in such circuits as sense amplifiers and pass transistor exclusive-or circuits. Excessive use of unidirectional transistors can cause the simulator to overlook serious design errors. Any circuit simulated with unidirectional transistors should be thoroughly analyzed with a different circuit simulator, e.g., the SPICE simulator.

Each transistor has a strength in the set $\{1, \ldots, maxtran\}$. The strength of a transistor indicates (in a simplified way) its conductance when turned on relative to other transistors which may form part of a ratioed path. When there is at least one path of conducting transistors to a storage node from some input node(s), the node is driven to a logic state dependent only on the strongest path(s), where the strength of a path equals the minimum transistor strength in the path. Thus, a stronger signal will always override a weaker one. Most CMOS circuits do not involve ratioing, and hence can be simulated with one transistor strength (maxtran=1). Most nMOS circuits can be modeled with just two strengths (maxtran=2), with pullup transistors having strength 1 and all others having strength 2. However, circuits involving multiple degrees of ratioing may require more strengths. ANAMOS 21 utilizes as many node sizes and transistor strengths as are used in the network file with the limitation that maxnode+maxtran<16.

The simulator models three types of transistors: n-type, p-type, and depletion. A transistor acts as a switch between source and drain controlled by the state of its gate node as follows: When a transistor is in an "unknown" state it forms a conductance of unknown value between (inclusively) its conductance when "open" (i.e. 0.0) and when "closed". The simulator models these transistors in such a way that any node with state sensitive to their actual conductances is set to X. The following table summarizes transistor state as a function of gate node states.

| gate | n-type | p-type | depletion |
|------|--------|--------|-----------|
| 0 | open | closed | closed |
| 1 | closed | open | closed |
| X | unknown | unknown | closed |

Normally, transistor switching is simulated with a unit delay model. That is, one simulation time unit elapses between when the gate node of a transistor changes state, and the subcircuit containing the source and drain nodes of the transistor is evaluated. However, a transistor can be specified to have zero delay, meaning that the subcircuit will be evaluated immediately.

Zero delay transistors are required only in rare cases to correct for the effects of circuit delay sensitivities. They can also be used to speed up the simulation, by creating rank-ordered evaluation of the circuit components.

FUNCTIONAL BLOCK MODEL

For both efficiency and flexibility purposes, a user may wish to describe some portion of a circuit in terms of its behavior rather than its transistor structure. The functional block capability provides a limited means to do this. Each functional block acts as a single circuit module.

VECTORS

A vector is an ordered set of circuit nodes. Vectors are provided only for convenience in the simulator, to allow a user to manipulate or observe the values on a set of related nodes. Most of the preprocessing programs simply pass a vector declaration along to the next stage. However, ANAMOS 21 also marks all vector elements as visible and hence will not eliminate them.

CIRCUIT PARTITIONING

Each module into which ANAMOS 21 partitions the initial circuit description 20 corresponds to either a functional block, or a transistor subnetwork. A subnetwork consists of a set of storage nodes connected by sources and drains of transistors, along with all transistors for which these nodes are sources or drains. Observe that an input node is not in any subnetwork, but a transistor for which it is a source (or drain) will be in the subnetwork containing the drain (or source) storage node. The behavior of a module is described by an evaluation procedure, provided by the user for a functional block or generated automatically for a subnetwork.

Each module has 3 classes of connections:

Unit-delay inputs: Inputs that affect the module 1 time unit after they change value.

Zero-delay inputs: Inputs that affect the module immediately after they change value.

Results: The outputs and state variables of the module.

For a functional block, these connections are explicitly defined in the block procedure. For a transistor subnetwork, the unit-delay inputs consist of the gate nodes of the unit-delay transistors, and the circuit input nodes connected to the drains and sources of the subnetwork transistors. The zero-delay inputs consist of the gate nodes of the zero-delay transistors. The result nodes consist of the subnetwork nodes that are not optimized away by ANAMOS 21.

Figure 3:
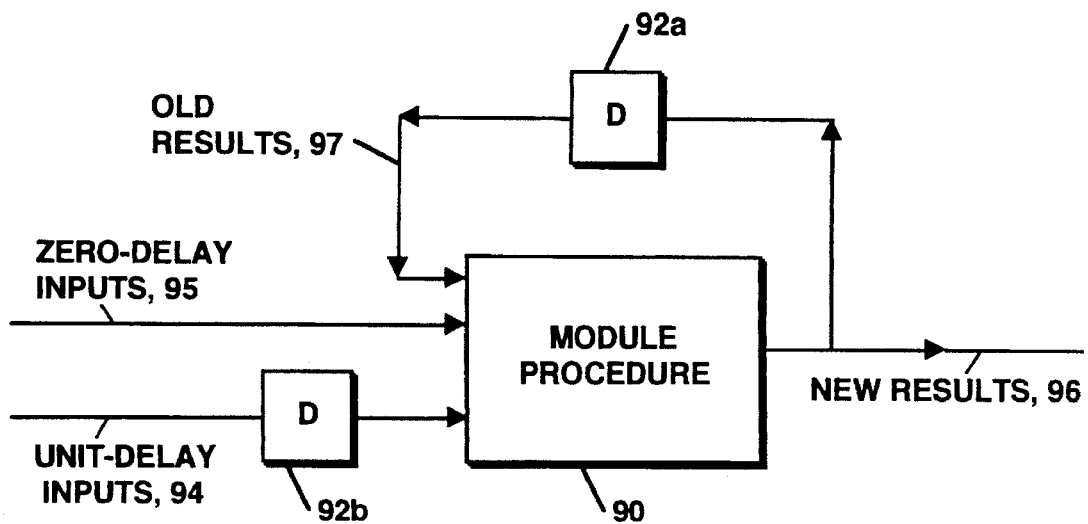
FIG. 3 is a block diagram of the finite state behavior of a circuit module.

As illustrated in FIG. 3, each module of model code 24 behaves as a finite state machine, computing new result values 96 for the results as a function of the old result values 97 on the results and unit-delay inputs 94, and the new values on the zero-delay inputs 95. The boxes labeled with "D" 92a–92b in FIG. 3 represent a delay of one simulation time unit.

The partitioned circuit obeys the following rules:

1. A node can be a result connection of at most one module.

2. There can be no zero-delay cycles, i.e., every cycle in the set of interconnected modules must be broken by at least one unit delay.

These rules restrict the class of circuits that can be modeled. The first rule implies that no node can be the result of two functional blocks. Furthermore, any node which is the result of a functional block is treated as an input node for any connected transistor circuitry. The second rule limits the use of zero-delay transistors and zero-delay functional block connections. In a diagram of a set of interconnected modules according to the scheme of FIG. 3, every cycle must contain a box labeled D.

TIMING MODEL

The simulation is designed for clocked systems, where a clocking scheme consists of a set of state sequences to be applied cyclically to a set of input nodes. The program assumes that the circuit clocks operate slowly enough for the entire circuit to stabilize between successive changes of clock and input data values. For synchronous circuits, the flow of time can be viewed at 4 levels of granularity:

| | |
|---|---|
| cycle | A complete sequencing of the clocks |
| phase | A period in which all clock and input values remain constant. |
| step | The basic simulation time unit. Within a phase, unit steps are simulated until the network reaches a stable state, or the step limit is exceeded. |
| rank | To model zero delay transitions. Each circuit module is assigned a rank greater than the rank of any module supplying a zero-delay input. A unit step involves a series of ranks, computing new values for nodes as a function of the old node values as well as the new values on nodes of lower rank. |

The clocking pattern is declared to the simulator with the clock command, in terms of the sequences of values to be applied to the clock nodes.

Unclocked circuits can also be simulated, although in a limited way, by interacting with the user at the phase level. For a combinational circuit, each phase represents the propagation of a set of values from the inputs to the outputs. For an asynchronous circuit, each phase represents a reaction by the circuit to a change in the control lines implementing the communication protocol (generally some form of handshaking.)

The simulator assumes that when the circuit does not reach a stable state within a fixed number of unit steps (determined by the step limit), an unbounded oscillation has occurred. It will then take one of two actions, depending on the setting of the command-line "oscillate" switch:

Stop the simulation phase and print an error message (oscillate=0)

Continue simulating, but set any changing nodes to X until the circuit stabilizes (oscillate=1, the default).

The initialized data structures produced by LGCC 23 represent the overall network structure. These data structures define the circuit nodes, their membership in subnetworks, and their controlling effects on other subnetworks. Their key features are the node array and the module instance array, which refer to each other. In addition to the node array and module instance array, LGCC generates array declarations which allocate (at compile time) storage for the simulation kernel's event lists.

NODE ARRAY AND MODULE INSTANCE ARRAY

Figure 4:
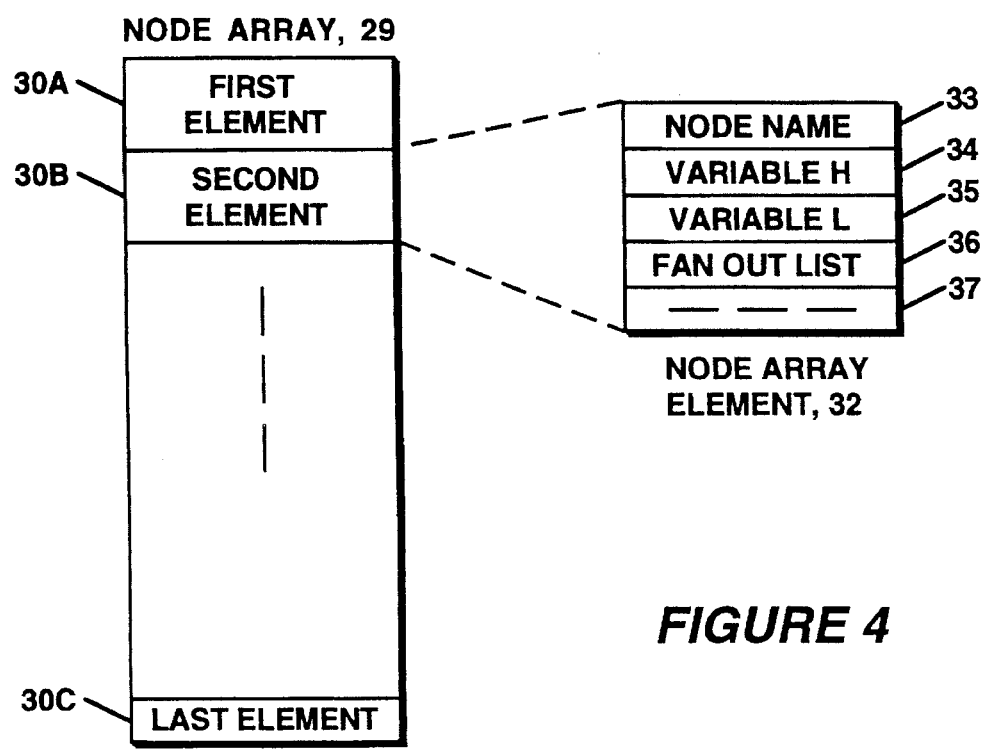
FIGS. 4, 5 and 6 are data structure diagrams for node arrays, node array elements, and module arrays, respectively.
Figure 5:
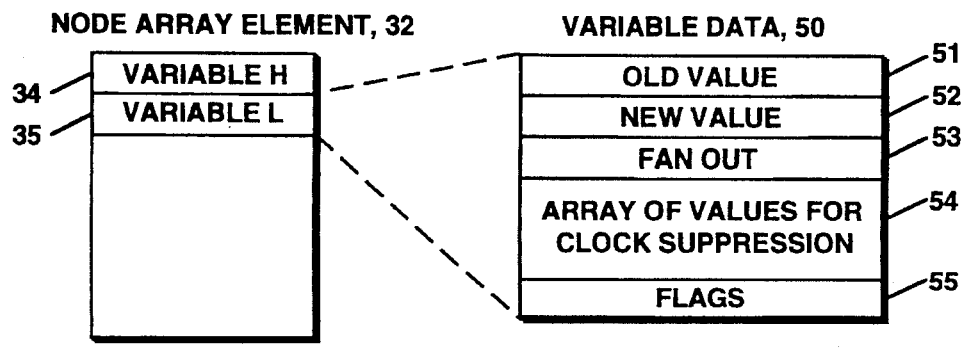

Referring to FIG. 4, each entry 30a–30c in node array 29 declares a node array element 32 with fields indicating its name 33 and two simulation variables 34–35 (for dual-rail encoding of node state). A simulation variable (referring to FIG. 5) is represented by its old and new values 51–52, and its fanout list 53. The old and new values are boolean values used to implement a strict unit-delay timing model. The fanout list 36 (FIG. 4) is a sequence of references to the module instances which are affected when the value of the variable changes. Various other flags 55 for internal use are also stored.

Figure 6:
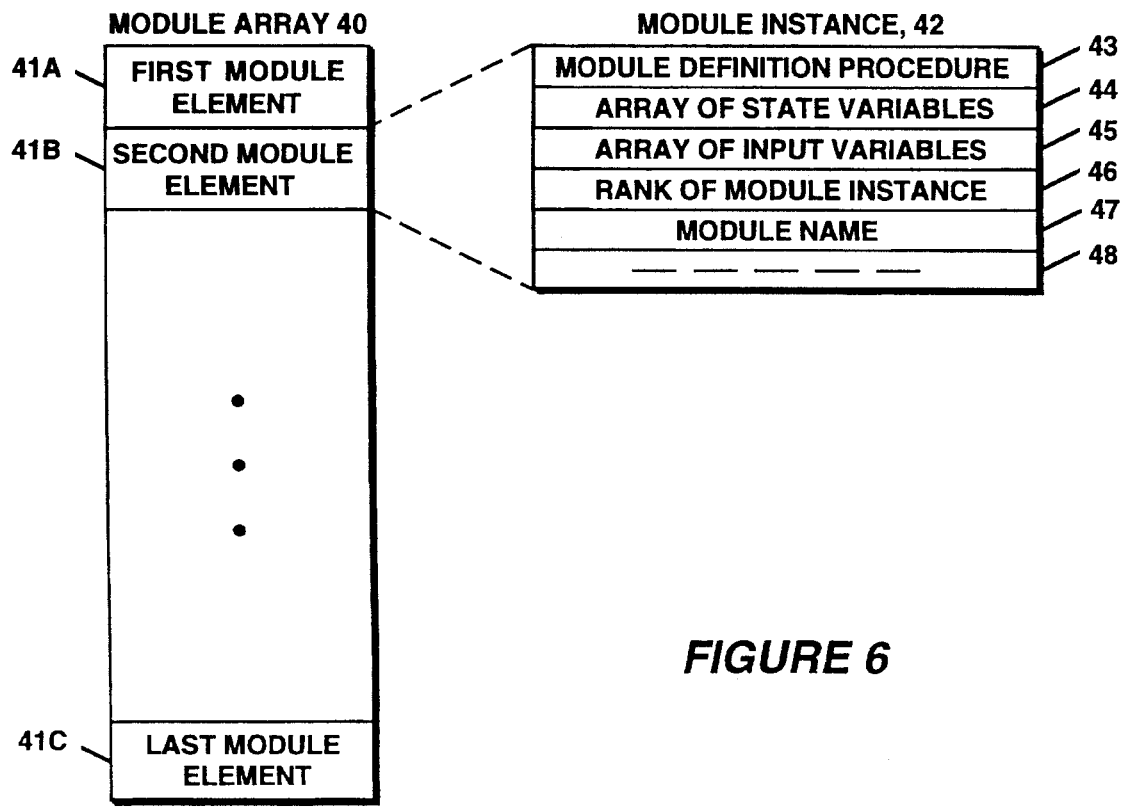

Referring to FIG. 6, each entry 41a–41c in module instance array 40 declares a subnetwork instance 42. The fields for an instance indicate the procedure describing subnetwork behavior 43, lists of state and input variables 44–45, and flags 46–48 used by simulation kernel's 25 (FIG. 2) event scheduler.

SIMULATION KERNEL

The simulated system appears to the simulation kernel 25 as a set of boolean state variables connected by procedural modules. Its design does not depend on the correspondence between pairs of variables and circuit nodes nor between module instances and subnetworks.

Simulation kernel 25 simulates of a phase as the basic simulator operation. During a phase, the program holds all data and clock inputs fixed and simulates unit steps until either it reaches a stable state or exceeds a user-specified step limit. Each unit step consumes one event list and produces another, where the initial event list indicates any new values on input nodes. The program makes one pass through the event list, calling module procedures to compute new values of the module output variables. It then makes a second pass to update the state variables and schedule all modules affected by the changing variables. Two passes are required to implement a strict-unit-delay model. The kernel requires only two event lists at any time, neither of which can be larger than the number of modules in the network.

EVALUATION FUNCTIONS

Each evaluation function produced by ANAMOS models the behavior of a channel-connected region under conditions of charge sharing and resistive conflict. Since an evaluation function is associated with each channel-connected region, each node is associated with only one evaluation function.

MONOTONIC PROPERTY

The functions produced by ANAMOS are three-valued, monotonic logic functions. The third value, X, indicates an unknown or indeterminate value. If we define a partial ordering over the set $\{0,1,X\}$ where $X<0$ and $X<1$, this ordering represents the certainty of a node value where X indicates an undefined state, while 0 and 1 represent fully defined states.

The monotonic property can be described as follows: Given a function, fn: $\{0, 1, X\} \rightarrow \{0, 1, X\}$ and elements a, b $\in \{0, 1, X\}$, a function is monotonic if it satisfies the condition:

$$a \leq b \rightarrow fn(a) \leq fn(b).$$

This property can be easily extended to vectors. Given two vectors A and B of size n, $$A, B \in \{0, 1, X\}^n$$

$A \leq B$ if $\forall i\ a_i \leq b_i$, $0 \leq i < n$, where a, b are elements of the A, B vectors respectively.

An important consequence of the monotonic property is that if an evaluation function is given some inputs equal to X, and the output is at a non-X value, the output cannot be changed due to any change in the inputs which were at X. For example, given a 3-input NAND gate with one input fixed to 0, the output will be fixed to 1 independent of the values of the other two inputs to the NAND gate.

TEMPORAL PROPERTIES

The temporal properties of the COSMOS unit delay simulator can be modeled in the following manner.

Let $$IN \in \{0, 1, X\}^n$$

be the internal node vector for the network. For example, the IN array in the circuit in FIG. 7 would consist of S1, S2, S3, and S_out. Each node in the IN array has at most one associated evaluation function. Let $$NS \in \{ANAMOS\ Functions\}^n$$

be an array of ANAMOS generated evaluation functions for the nodes in the IN array. For example, the evaluation functions for the circuit in FIG. 7 would consist of the evaluation functions, M1, M2, M3, and INV, which correspond to nodes S1, S2, S3, and S_out, respectively. Finally, let $$PI \in \{0, 1, X\}^m$$

be the control vector that represents the external/primary inputs to the network. For example, the control node array for the circuit in FIG. 7 would consist of S_in, PHI_3, PHI_1, and PHI_4. The unit-delay nature of the network can be represented as follows:

$$\forall i\ IN^i_{t+1} = NS^i(IN_t, PL_t) \qquad (1)$$

where $1 \leq i < n$ and i, t $\in$ N where t is the unit-step time.

Zero-delay simulation can be accommodated in this model by collapsing the internal nodes of a zero-delay region, and combining the evaluation functions into a larger evaluation function.

SYNCHRONOUS CIRCUIT MODEL

Figure 1:
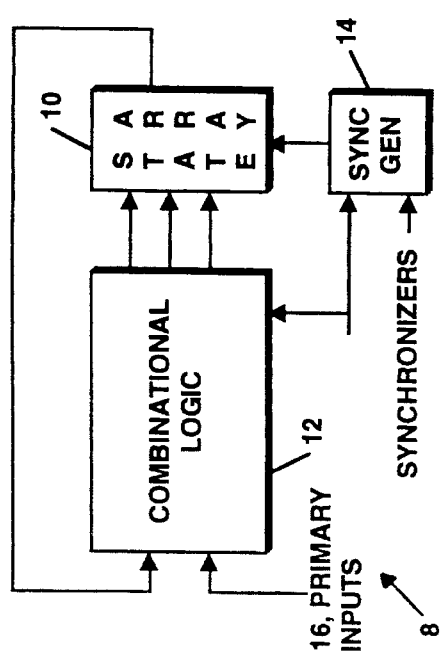
FIG. 1 is a diagram of a synchronous circuit.

A Synchronous Circuit (SC) model may be abstracted from the above general unit-delay simulation model. FIG. 1 is an informal view of this model. Referring to FIG. 8, a more formal description of a synchronous circuit model starts by partitioning the IN array and the PI arrays.

The IN array is partitioned into two arrays: the PS and CS array. The PS array consists of nodes which form the permanent state of the network. This array, which is not unique, generally consists of all the outputs of sequential elements in the network. The CS, combinational state, array consists of all the nodes whose state can be derived from the state of the PS array and the PI array.

The PI array is partitioned into the DI and CLK arrays. The CLK array consists of all the periodic signals that are the synchronizers for the synchronous circuit. The DI array consists of the remaining signals in the PI array; these signals are the data inputs to the synchronous circuit. In addition, we define the term quiescent network. A quiescent network is a network in which an additional evaluation of equation (1) will not cause any changes in the IN array. A quiescent network represents the state of the network after some change in the PI array, and after sufficient (unit delay) time to settle. In an event-driven simulator, the simulation until quiescence would translate to a simulation until the event list is empty.

Finally, we define some rules of operation for the SC model:

1. The CLK array consists of "well defined" periodic signals.
2. The PS array can only be changed based on a change of state in the CLK array. In addition, the DI array can only change when the CLK array changes.
3. The CLK array can only change state when the network is in a quiescent state.
4. After a change in the CLK array, the network must reach a quiescent state. Oscillations are not allowed.
5. The network evaluation to reach the quiescent state must be race free, so that the network must reach the same quiescent state independent of the order of evaluation.

The temporal behavior of the SC model can be modeled by a finite state machine. In this state machine, PS nodes form the state elements, the simulation until quiescence produces the next state function, and the movement to the next state occurs on a change in the CLK array. For each simulation until quiescence, some nodes in the PS array are latched, and the new values propagate through the combinational logic to the inputs of PS node functions.

PROPERTIES OF SC MODEL

The synchronous circuit model has properties that will be useful for clock suppression algorithms.

Periodic Signals Property

The CLK array consists of nodes that obey the following property. Given a function f: $R \to \{0,1,X\}$ that takes a real number, R, as the input and produces a three-state value as the output, $$f(t) = f(t+T) \qquad (2)$$

where T is the period. The term "well defined" refers to the fact that the value of f is known for all values of $t \leq 0$.

The periodic signals property states that given well defined periodic signals for the elements of the CLK vector, the CLK vector as a whole must be periodic as well. More formally, given $$vf: R \to \{0,1,X\}^{cn},$$

a function that generates the values for a CLK vector of size cn, $$vf(t) = vf(t+CT) \qquad (3)$$

where CT is the period for the CLK vector.

The movement of the CLK vector is as follows: $CLK_{t0}$, $CLK_{t1} \ldots CLK_{tCT}$, where $t_0, t_1, t_2 \ldots t_{CT}$ refer to the time values at which the CLK vector changes state. We define a term, phase, to refer to each of the stable states for the CLK vector. In addition, we define an array called the phase-waveform that is the size of the number of phases in one cycle defined by vf.

Figure 9:
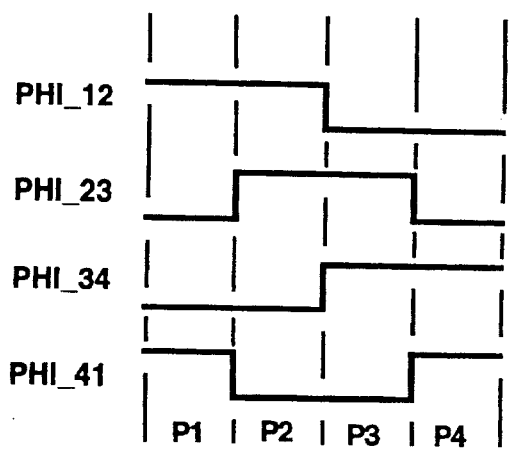
FIG. 9 is a timing diagram of periodic signals.

For example, FIG. 9 shows four periodic signals PHI_12, PHI_23, PHI_34, and PHI_41. These four signals create four phases: P1, P2, P3, and P4. The CLK array contents for PHI_12 would be PHI_12[1]=1, PHI_12[2]=1, PHI_12[3]=0, and PHI_12[4]=0.

Phase-Waveform Property

The phase-waveform property states that the phase-waveform array can contain all the information needed to store any periodic waveform on any given node in the synchronous circuit.

The SC model states that only a change in the CLK array, and thus a change in phase, can cause a change in the PS array. By definition, the PS array determines the context for the network for a particular phase. Therefore, for that phase, storage of the quiescent state for any node is sufficient to characterize the behavior of that node. Since, for the evaluation to reach the quiescent state, it must be race-free, any intermediate values for the node are not relevant.

This property holds for all phases, so a data structure phase-waveform the size of the number of phases, phase-waveform, is sufficient to model any periodic waveform on any node in the SC network. This property also implies that the evaluation per phase can be rank-ordered, since only the quiescent value is relevant, and the network must reach quiescence.

Monotonicity property

The monotonicity property states that since the underlying functions are monotonic and monotonicity holds over functional composition, monotonicity holds over a netlist of monotonic functions that form a combinational evaluation.

Each phase represents a combinational evaluation, so monotonicity holds over a phase and a phase-waveform. That is, if some internal nodes are at fixed values in a given phase due to only the CLK vector, these internal nodes will always be at that state for that particular phase for every cycle, and changes on the other inputs will not change the state of these internal nodes.

Hibernating Module Property

The hibernating module property states that given:

1. a combinational evaluation function with phase-waveforms at the inputs and the outputs, and 2. an event at the inputs that deviates from the value in the phase-waveform, the output phase-waveforms can be completely modeled after one cycle of evaluation.

At least one cycle is needed because the input change can affect the output at the present phase. However, an output change at any phase can change the output at other phases because of the events related to the clocks. Therefore, at least one cycle of evaluation is necessary. One cycle is sufficient because the function is combinational and after one cycle the phase-waveform is fully characterized given the present input states.

CLOCK SUPPRESSION

The objective of clock suppression is to model the actions of the clocks without simulating them at each cycle, thus reducing futile evaluations. Given the SC model described above, there are several alternatives for accomplishing this objective. As mentioned, the state-based approaches are inadequate because of the need for function tables for general combinational functions, and the interconnect-based approaches do not effectively address data-dependent periodicity, especially in relation to precharge circuits. Below we discuss three approaches to clock suppression—partitioned, dynamic, and static. We describe the static approach in detail.

Partitioned Clock Suppression

Partitioned clock suppression is based on the phase-waveform property described above. In this algorithm, the network is simulated independently for each phase. The strategy is to:

1. Duplicate the network for each phase.

2. Simplify each of the phase networks based on the CLK array values.

3. Simulate any phase using the appropriate phase network.

4. Copy node values between phases, or change all evaluation functions to use the same array of node values.

The main advantage of the partitioned clock suppression algorithm is the ability to simplify the network based on the context of the CLK array, and on the simplicity of the simulation algorithm. The suppression of the clocks is implicit in the simplified phase networks. Simulation between phases is performed by switching between the phase networks.

The main disadvantages are the complexity of the network compilation, and the potential increase in memory usage. In the worst case, the simulation data structures may have to handle a network that has size P*ND where P is the number of phases, and ND is the size of one copy of the network data structures (fanout, evaluation functions)

This increase in memory usage also may reduce CPU performance if the increased memory usage results in excessive cache misses.

Dynamic Clock Suppression

Dynamic clock suppression is based on the phase-waveform and hibernating module properties. In this algorithm, an observer is associated with each evaluation module. This observer stores the history for the nodes associated with the evaluation module. If the second cycle does not change the history generated by the first cycle, the evaluation function can be placed in a hibernating state. In the hibernating state, the evaluation function ignores event changes to the inputs that agree with the history already recorded, and presents the fanout modules with a phase-waveform that contains the calculated output values.

The major advantage of the dynamic clock suppression algorithm is that it catches all periodic activity, but evaluation of non-periodic evaluation functions is more expensive because of the overhead of the observer. Also, the memory needed is at least P*N, where P is the number of phases and N is the number of nodes in the network. The amount of memory needed is less than that needed in the partitioned clock suppression algorithm, but can still be significant.

Static Clock Suppression

Static Clock Suppression (SCS) is a compromise between the dynamic clock suppression algorithm and normal event-driven simulation. SCS conceptually mimics the dynamic clock suppression algorithm without the use of an observer. Instead of an observer, a static analysis is performed before simulation begins. In this analysis, evaluation functions whose activity is likely to be suppressed are marked as SCS modules. SCS modules are further analyzed to calculate pre-compiled responses to events at their inputs. The hibernating module property is heavily leveraged to calculate the response function, and the monotonicity property is used to minimize the size of the response function. During simulation, all other modules are evaluated using conventional event-driven simulation.

SCS removes the observer at the cost of losing the suppression of some data dependent periodic activity. As a result of the conventional event-driven simulation of non-SCS modules, the algorithm tolerates asynchronous activity for those modules. Thus, unlike the partitioned and dynamic clock suppression algorithms, a mixed synchronous and asynchronous circuit can be simulated correctly if the asynchronous portions of the circuit are non-SCS modules. For example, this feature can be quite useful when simulating CPU interactions with asynchronous main memory.

SCS IMPLEMENTATION

Presimulation

Presimulation is invoked at the start of simulation where only the clocks and constants are known. In the presimulation step, an experiment, described below, is performed that determines nodes chosen to be modeled by phase-waveforms. All other nodes will be simulated using conventional event-driven simulation.

Figure 10:
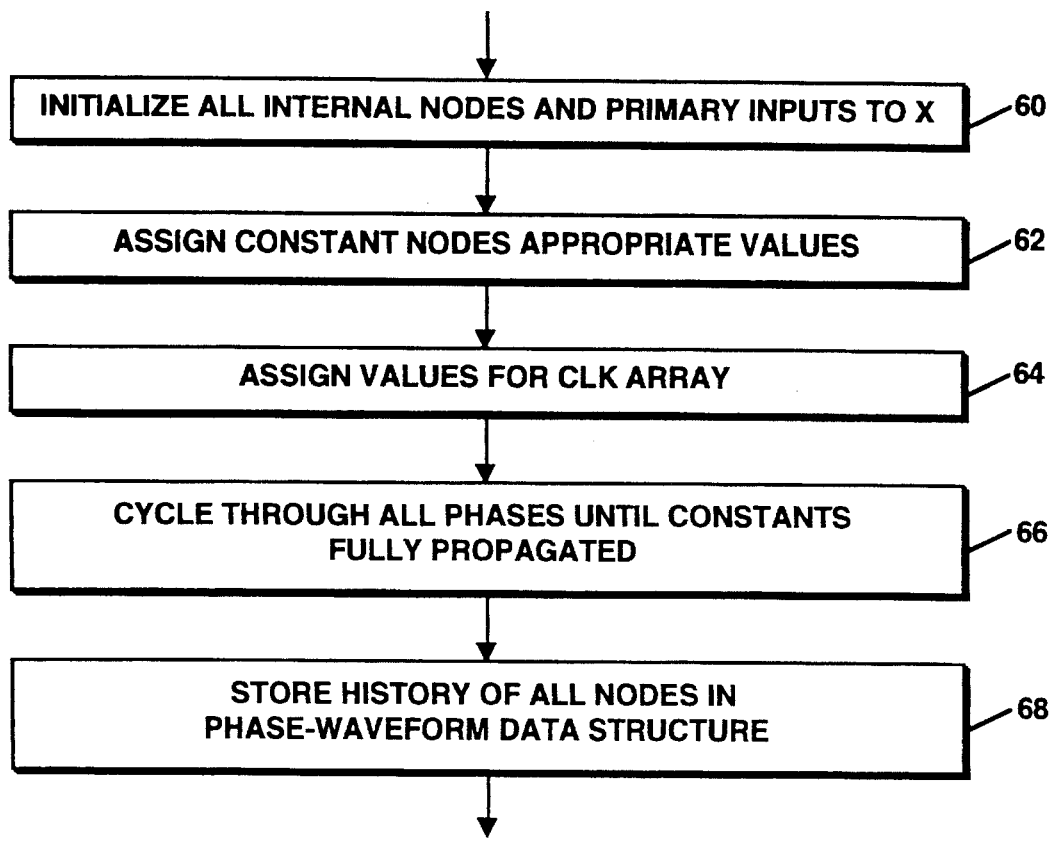
FIG. 10 is a flow diagram of static aspects of a static clock suppression (SCS) algorithm.

Referring to FIG. 10, in the experiment, the presimulation algorithm initializes all internal nodes and primary inputs to X 60, and assigns constant nodes to their appropriate values 62. The next step 64 is to assign values for the CLK array, and cycle through the phases until the constants are fully propagated 66. The test for full propagation consists of checking that the IN state of a particular phase is identical to the IN state of the phase in the previous cycle. In the next step 68 after constant propagation, the history of all nodes is stored in a phase-waveform data structure 64 (See FIG. 13).

Next, all nodes in the network are partitioned into three categories, A, B, and C.

Category A includes nodes whose phase-waveforms contain only boolean values, i.e., nodes whose value is always known. These nodes are most likely to be in the clock buffering tree.

Category B includes nodes with no boolean states in the phase-waveform. For the static clock suppression algorithm, these nodes will be ignored, and their phase-waveform data structure memory is released. The normal event-driven algorithm will maintain their values, but it should be noted that by ignoring these nodes, some possible suppression of data-dependent periodic behavior will be missed.

Category C consists of nodes with some phases at boolean values, and some phases at an X value. For the boolean phases, SCS takes advantage of monotonicity to provide the output without evaluation. But, for the phases with X at the output, evaluation must determine the final value.

Figure 7:
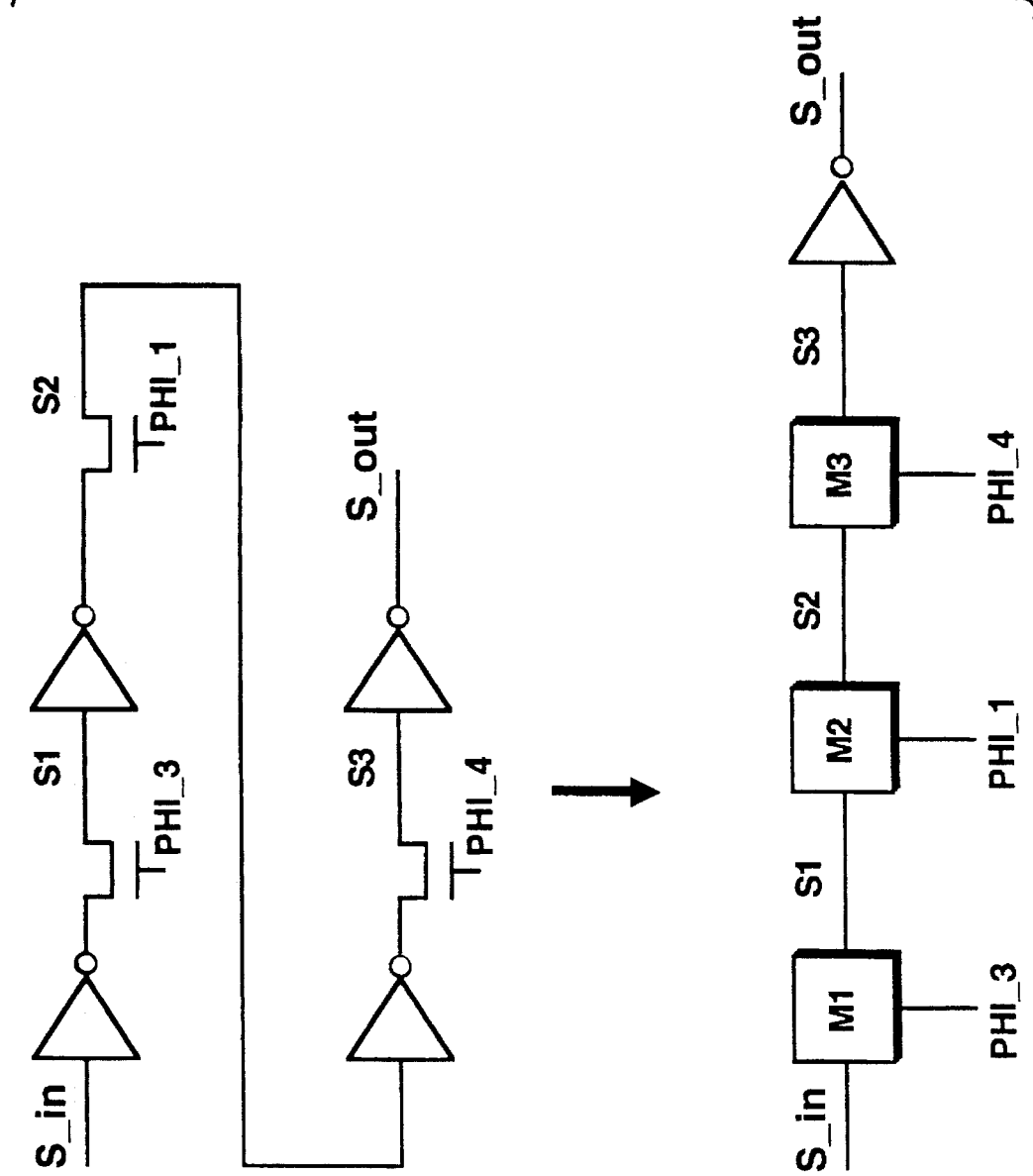
FIG. 7 is a block diagram of a shifter circuit.
Figure 11:
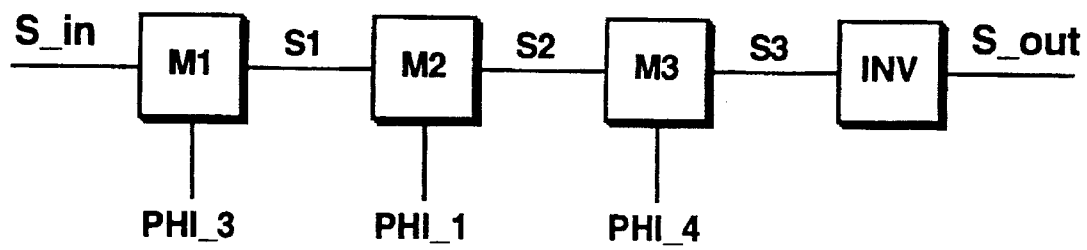
FIG. 11 is a diagram of the result of presimulation on the circuit shown in FIG. 7.

For example, FIG. 11 shows the result of the presimulation step on the simple shifter circuit presented in FIG. 7. After presimulation, the clock nodes PHI_3, PHI_1, and PHI_4 are category A nodes, and S_in, S1, S2, S3, S_out are category B nodes. In this example, there are no category C nodes, but if one of the outputs were precharged, that output would be in category C.

In addition, all multiple output evaluation functions are required to have all the output nodes in a phase-waveform if any one of the output nodes is a phase-waveform. This rule is instituted because it is likely that if one output of an evaluation function is periodic, the others will become periodic, based on data inputs. Also, the event analysis step is simplified by this rule.

Event Analysis

Given the node classifications above, an event analysis in advance of running the simulation is performed that determines the appropriate response to an event at the input. An event will be defined as a change in state for a category B node, and a deviation from the phase-waveform for a category C node. An event associated with a category A node is invalid because monotonicity requires the boolean values to stay constant. All evaluation modules that have category A or C nodes as inputs are classified as SCS modules.

Evaluation functions whose outputs are category A nodes require no action. These modules should never be evaluated in augmented simulation. Evaluation functions whose inputs are all category B nodes are non-SCS modules, so require no action because these modules will be evaluated using the normal event-driven simulator. All other SCS modules must be analyzed to calculate the appropriate response to an input event.

Using the hibernating module property, the most conservative response would schedule an evaluation for every phase for one cycle after the event has occurred. But, phase is a global network property, and an evaluation per phase may cause module evaluations that may not have occurred in the conventional event-driven simulator. In order to avoid extraneous evaluations, a module state analysis is performed.

In the module state analysis, all the module inputs, including the old state of the outputs if needed, are considered in a vector form, and a module signature is generated. The module signature assigns a unique value to every unique vector for the module inputs and outputs. Any change of the module signature between phases is recorded, and evaluation is scheduled only in the phases where the module state vector has changed. In addition, if the output state is boolean for any of the scheduled phases, that scheduled event is dropped.

Figure 12:
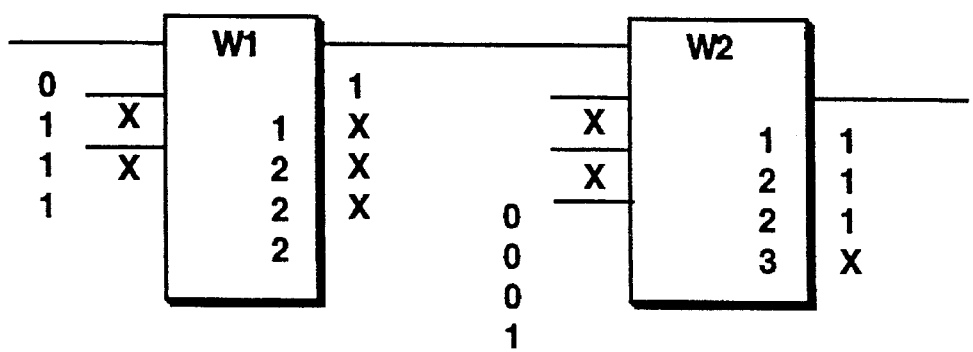
FIG. 12 is a diagram of a 4-phase design with two module evaluation functions.

For example, FIG. 12 shows a 4-phase design with two module-evaluation functions. The first module, W1, is driven by a category A node and produces a category B node on the output. The module signature for W1 is shown inside the module box. Given an event on the other inputs, the only interesting times to evaluate the module W1 are in phase 1 and phase 2. But, due to the monotonicity property (defined above), any evaluation in phase 1 will yield one at the output, so given any event to the input of W1, a response function of an evaluation in the next phase 2 is sufficient to correctly fill the W1 output phase-waveform. If the event arrived in phase 3 or 4, an immediate evaluation is also necessary.

The analysis of the second module, W2, proceeds in a similar fashion, but serves to illustrate a subtle point. Analyzing W2 independently is not sufficient to generate the correct module signature. The initial analysis of module W2 says that phase 2 and phase 3 have the same identification. But, since the module is fed by a category C node that has X values for both phase 2 and 3, an X→X event can occur. That is, the two X's may have different values for the two phases. To address this problem, the module state-analysis algorithm performs a dependency check which determines if the two X's can hold different values. The dependency check is performed by backtracking through the driving modules of the category C nodes. If the category C node is driven by a module where the module signatures for the phases in question are equal, the two X's must be the same, and the module signature is correct. If the driving module can generate different values for the X's, the module signature is updated, and extra evaluations are needed. For example, the W1 module was driven by a category A node, so the module signature for W2 was correct. In any case, the output is fixed at both phase 2 and 3, so the module signature at those two phases is not relevant.

The SCS algorithm expects the circuit to have synchronous behavior, but performs all of its operations on the network netlist. Since the backtracking algorithm works on the netlist, feedback can be a problem. The backtracking algorithm detects feedback, and changes category C nodes to category B nodes until the feedback is broken from a dependency-check point of view.

The first two parts of the SCS algorithm, presimulation and event analysis, are static, taking place prior to actual simulation. For the third part of the algorithm, the simulation kernel is modified to use the information derived in the presimulation and event analysis steps described above.

MODEL CODE AUGMENTATION

The SCS algorithm augments the model code produced by the original COSMOS implementation. In particular it creates another data structure, the module evaluation array. Referring to FIG. 13, module evaluation array 60 has an evaluation entry 62a–62c for each module to be simulated. (There is an entry corresponding to every module instance 42 in module array 40 of FIG. 6.) Each evaluation entry 62 is either 0 or a pointer to a phase signature array 64. An evaluation entry equal to zero corresponds to a category B node and implies that the simulator kernel must use its normal event-driven algorithm to evaluate the node. For non-zero evaluation entries the kernel is dealing with a category C node and can use the pointed to phase signature array 64 to determine which phase of the clock cycle require actual evaluation and which are constant. Phase signature array 64 has one entry 66a–66c for each phase.

Referring to FIG. 14, variable elements 34–35 in node array elements 32 are modified to include array 54 of values for clock suppression.

As an example, FIG. 15 is the output from the first two phases of the SCS algorithm for a simple AND gate with inputs A and B and output OUT.

Augmented Simulation

Figure 16:
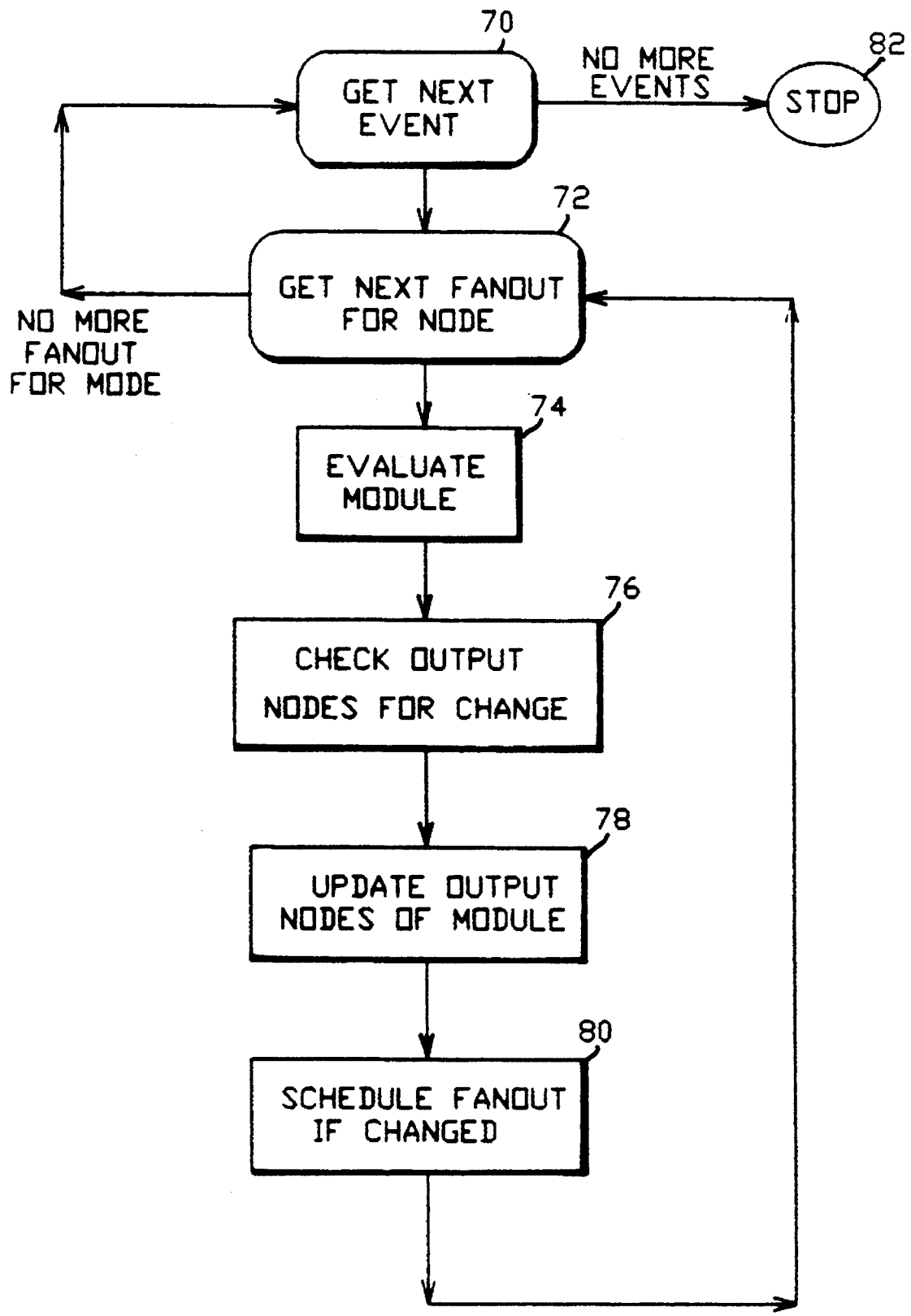
FIGS. 16 to 26 are flow diagrams of SCS.

Once the response functions have been calculated the network is ready to be simulated. Augmented simulation, as the name implies, augments the conventional event-driven simulator to properly process the SCS modules. Referring to FIG. 16, a high-level view of the conventional COSMOS unit delay algorithm is:

1. Get next event (state change on a node) 70.
2. For all fanout 72
   (a) evaluate module 74
   (b) check output nodes for change 76
   (c) update output nodes of module 78
   (d) schedule fanout if output changed 80.
3. Go to 1 or, alternately:

1. Dequeue event list.
2. If empty, exit.
3. Evaluate module.
4. Check output(s) for change.
5. Update output(s) with new state.
6. Schedule fanout module if changed.
7. Go to 1.

In order to implement Static Clock Suppression, the simulator is augmented with respect to the previous loop in the following four places in kernel simulation procedure CLK_STP (see the attached source code appendix A, incorporated by reference):

1. Evaluate Module: The SCS simulation algorithm has to update the module inputs from the phase-waveform data structure before evaluation. (By assigning the appropriate mod_info data to the clk_mod variable.)
2. Check Outputs: The SCS algorithm has to check the phase-waveform data structures for change from expected behavior (a change with respect to the "phase waveform" is also a valid change). This is done by comparing the old and new values of the variables.
3. Update Outputs: The SCS algorithm has to update the phase-waveform data structures.
4. Schedule Fanout: The SCS algorithm has to schedule across phases as well as within a phase.

As is demonstrated below, all four changes can be invoked conditionally, based on a SCS module flag, so that the only penalty for non-SCS simulation is a test of the SCS module flag.

Figure 17:
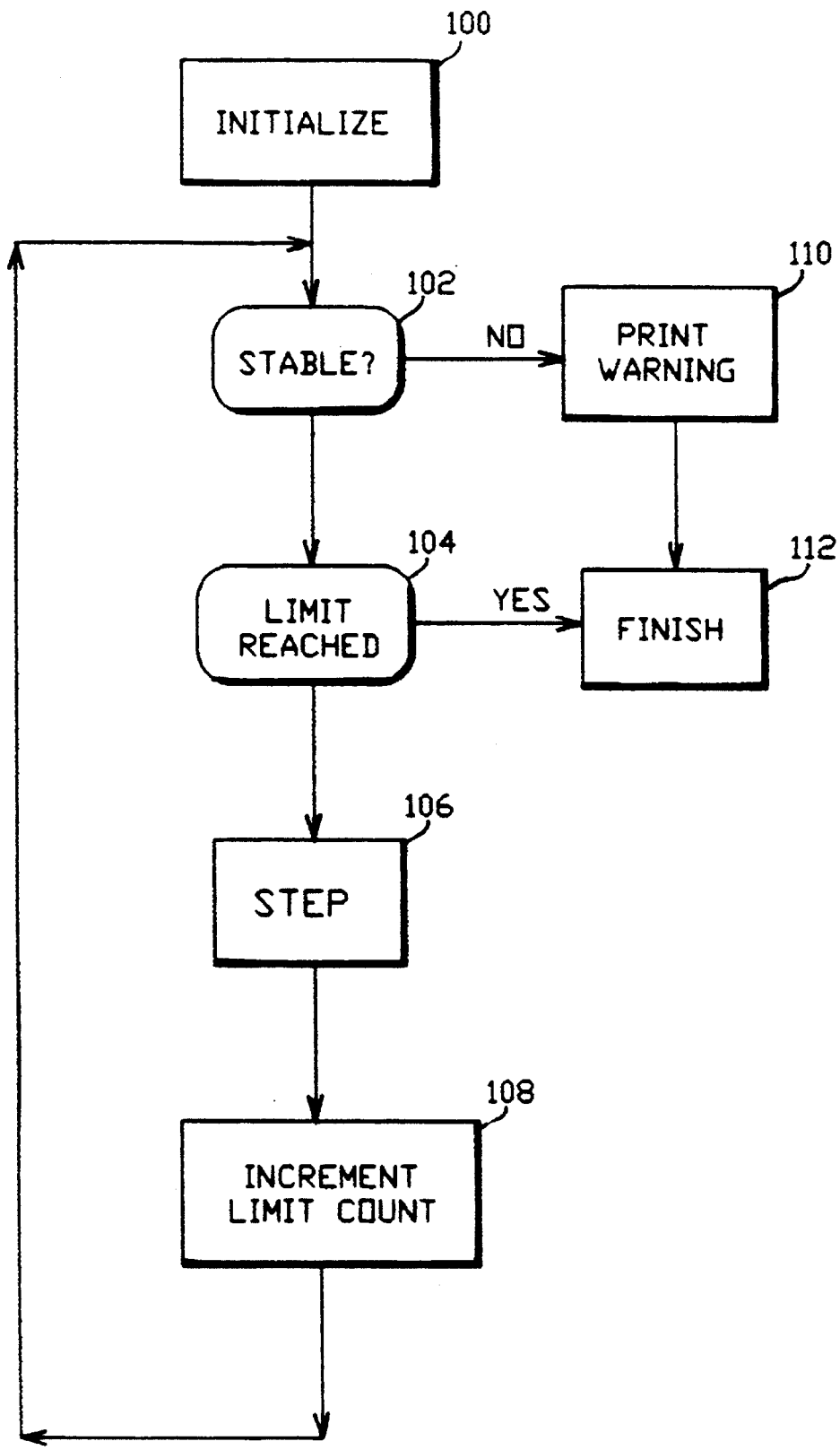

FIG. 17 describes the main simulation loop of simulation kernel 25 for executable simulator 28 (FIG. 2). Before the loop begins all data structures and control variables are initialized 100. The circuit is assumed to be stable at the start of simulation. The loop first checks that the circuit is still stable 102, and, if not prints a warning 110 and terminates 112 the simulation. (In some versions of COSMOS the kernel may continue to simulate the circuit, setting all values to X). If the test for stability 102 passes, then a check is made to determine whether a user-specified limit (of passes through the simulator loop) has been reached 104. If the limit has been reached then the simulation is terminated 112, otherwise a single step, corresponding to one clock cycle, STEP 106, through the circuit is performed. After STEP 106 is performed a counter is incremented 108 and the test for circuit stability 102 is performed again.

Figure 18:
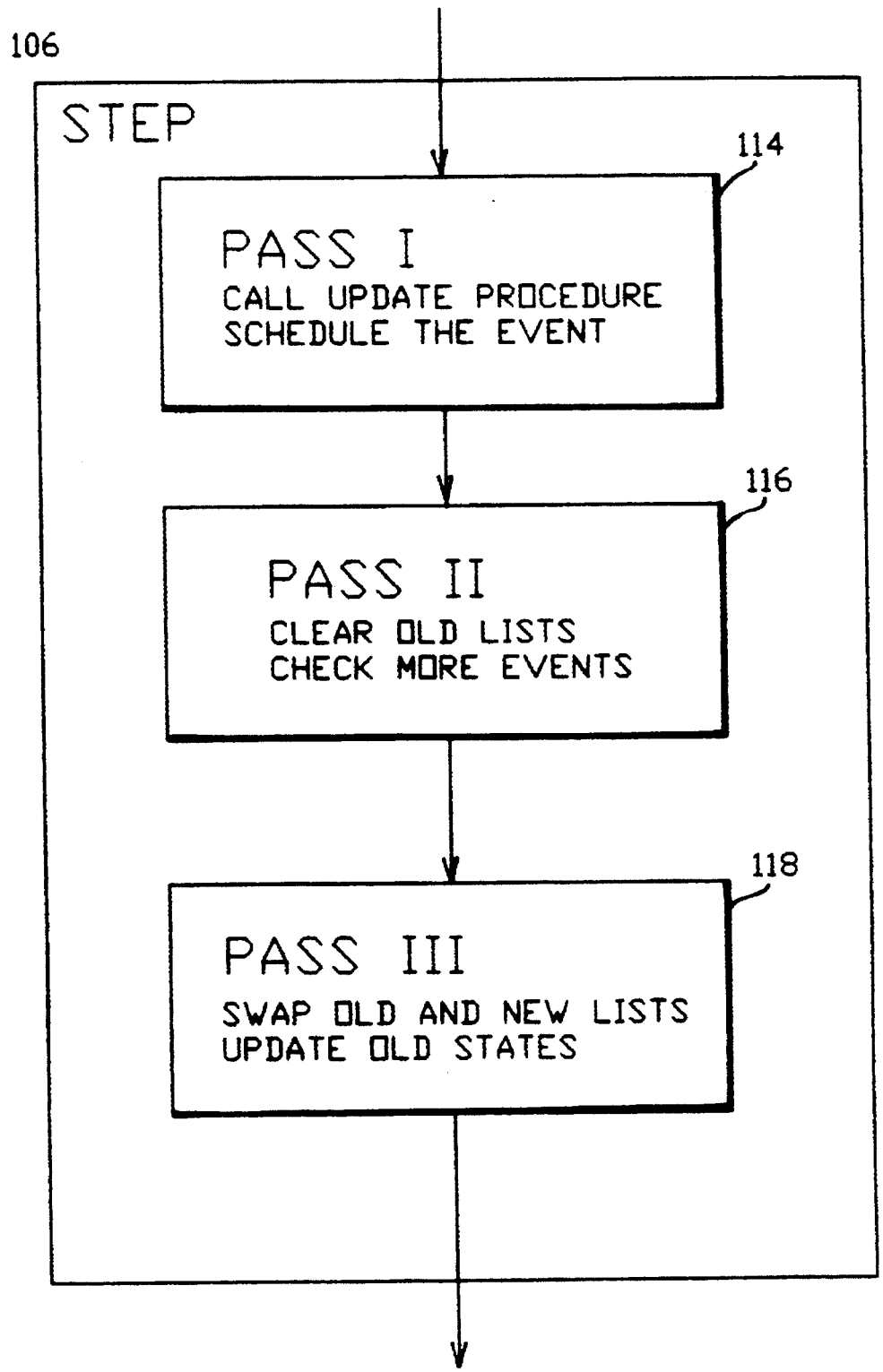

Referring to FIG. 18, STEP 106, consists of a three pass process. In summary, Pass I 114 calls the update procedure and schedules the events, Pass II 116 clears old event lists and checks for more events, and Pass III 118 swaps the old and new lists and updates old states.

A more detailed description of the processing in each pass is as follows:

Pass I 114:

For each module M in old event list (ordered by rank)

call update procedure for module M;

schedule the events:

for each output variable O of module M such that old state !=new state put output variable O in update list put zero delay fanout in old event list put unit delay fanout in new event list.

Pass II 116:

clear old flags and make old event list empty.

check if more events.

Pass III 118:

old lists<–new lists for each state variable V in update list old state<–new state clear fanout flag for V update list<–empty The changes required to simulation kernel 25 (FIG. 2) in order to implement the Static Clock Suppression algorithm are limited to Pass I 114 of STEP 106.

Figure 19:
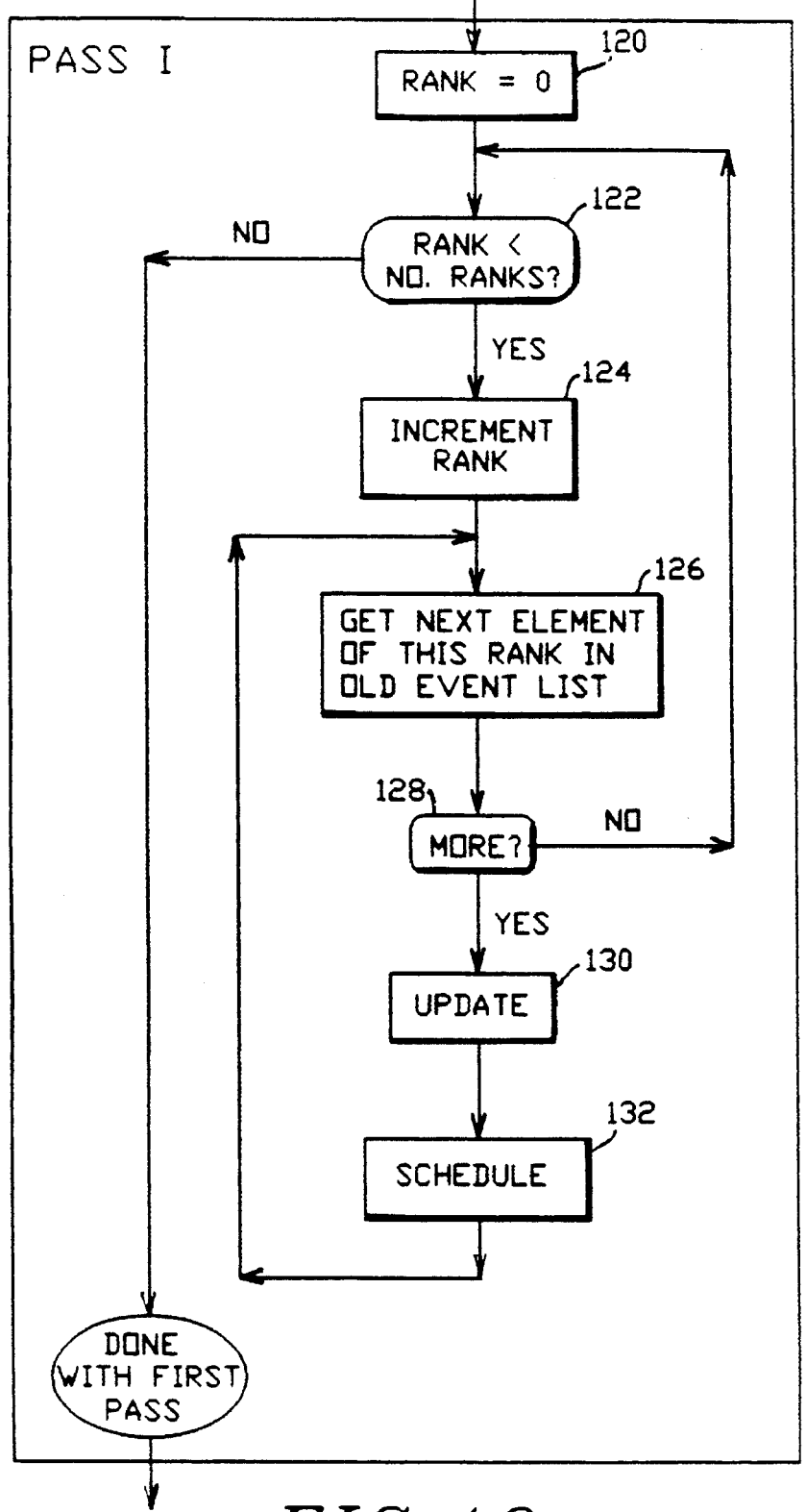

FIG. 19 depicts the processing required in Pass I 114 of STEP 106. In order to loop over all ranks, a counter variable "rank" is initialized to zero 120. Step 122 determines whether or not all ranks have been considered. If not, then the rank count is incremented 124 and the old event list for this rank is processed 126–132. Step 126 gets the next element of this rank in the old event list. If there are no more elements, step 128, then next rank is processed 122–124. If another element is found then Update and Schedule 132 are performed, after which control flow returns to step 126.

Figure 20:
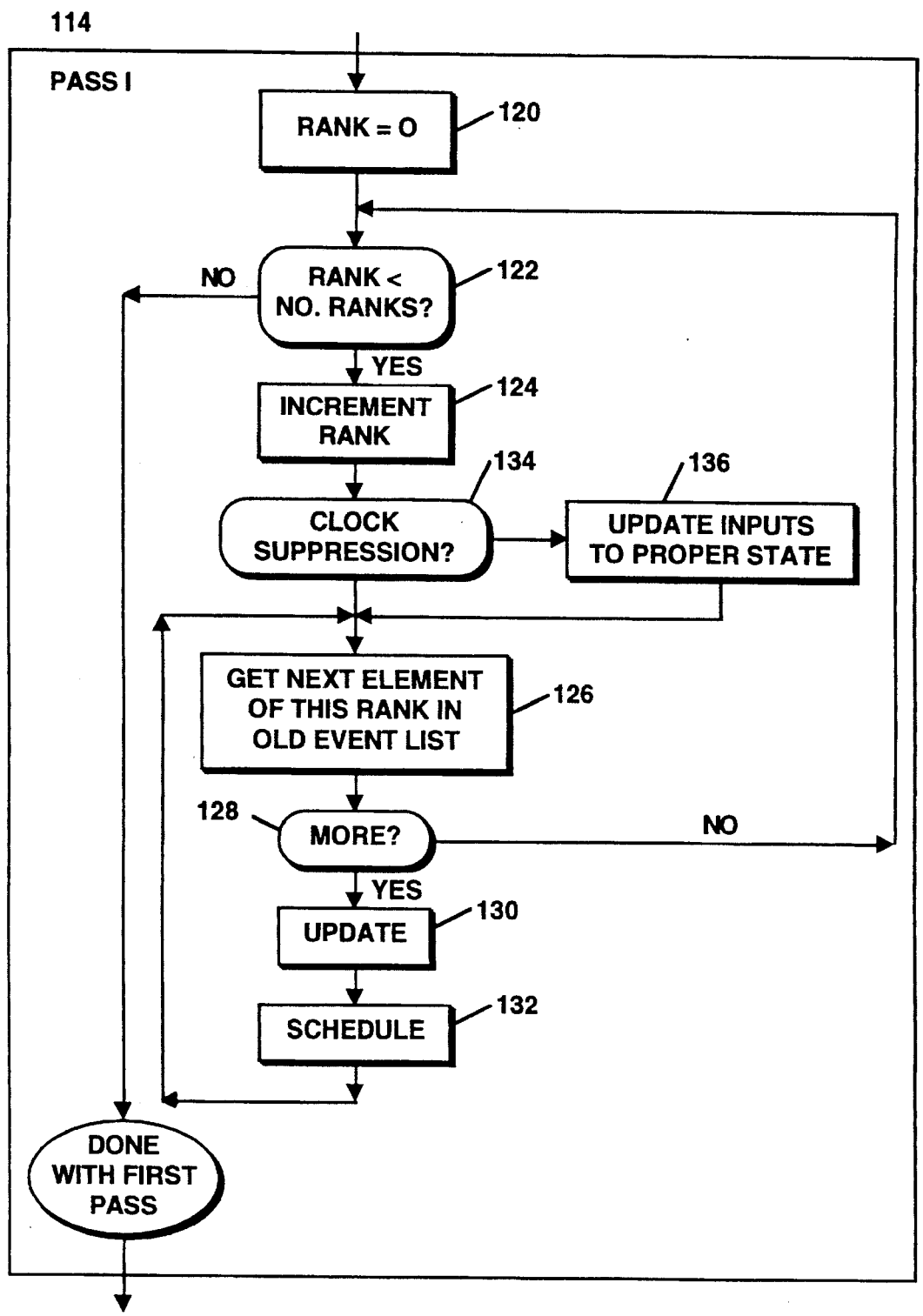

FIG. 20 depicts the processing required in Pass I 114 of STEP 106 when Static Clock Suppression is implemented. Note that, at this level, the only change is after Increment Rank 124, where test "Clock Suppression?" 134, is made to determine if clock suppression is in effect. If not then the control flow proceeds as described above, otherwise the inputs are updated to their proper states 136 after which processing proceeds as described above at step 126. The test "Clock Suppression?" 134 is implemented as a simple check of a boolean value in procedure "clk_step" (which implements the Static Clock Suppression version of "STEP"). Updating the inputs to their proper state 136 is performed by procedure "clk_sup_inp_setup". Partial C code for steps 134 and 136 is simply:

```
if (clk_mod !=0) clk_sup_inp_setup(...)
```

Figure 21:
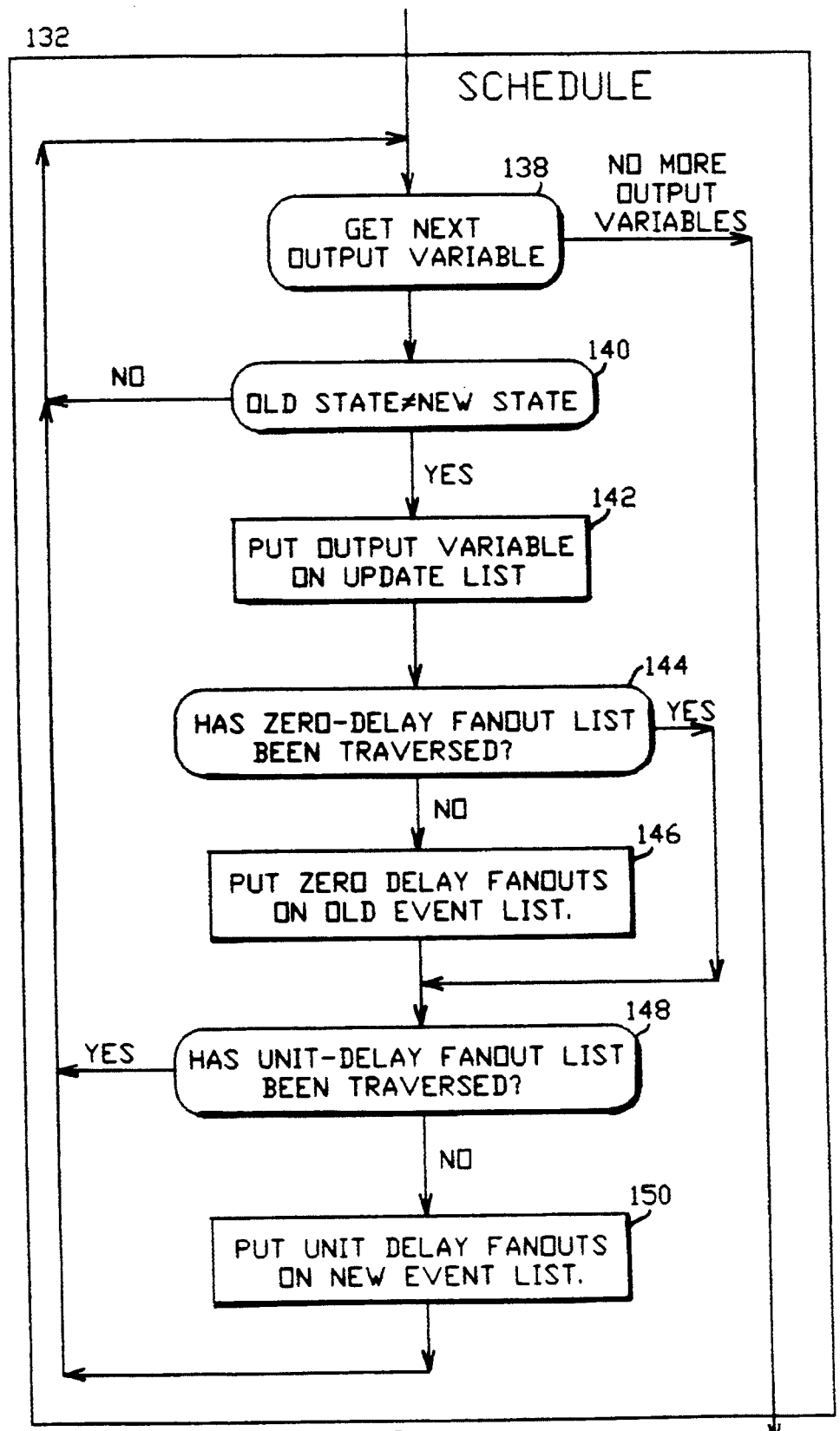

Other changes to Pass I 114 for Static Clock Suppression take place in Schedule 132. FIG. 21 depicts the Schedule 132 step in the non-SCS version of COSMOS.

Referring to FIG. 21, first the next output variable is obtained 138. If there are no more output variables then flow continues at step 126 (FIGS. 19, 20). For each output variable a test 140 is made to determine if its old state is equal to its new state. If so then the next output variable is obtained 138, otherwise the output variable is put on the update list 142. If the zero-delay fanout list for this output variable has not been traversed 144, then the zero-delay fanouts are put on the old event list 146. Similarly, if the unit-delay fanout list for this output variable has not been traversed 148, then put the unit delay fanouts on the new event list 150.

Figure 22:
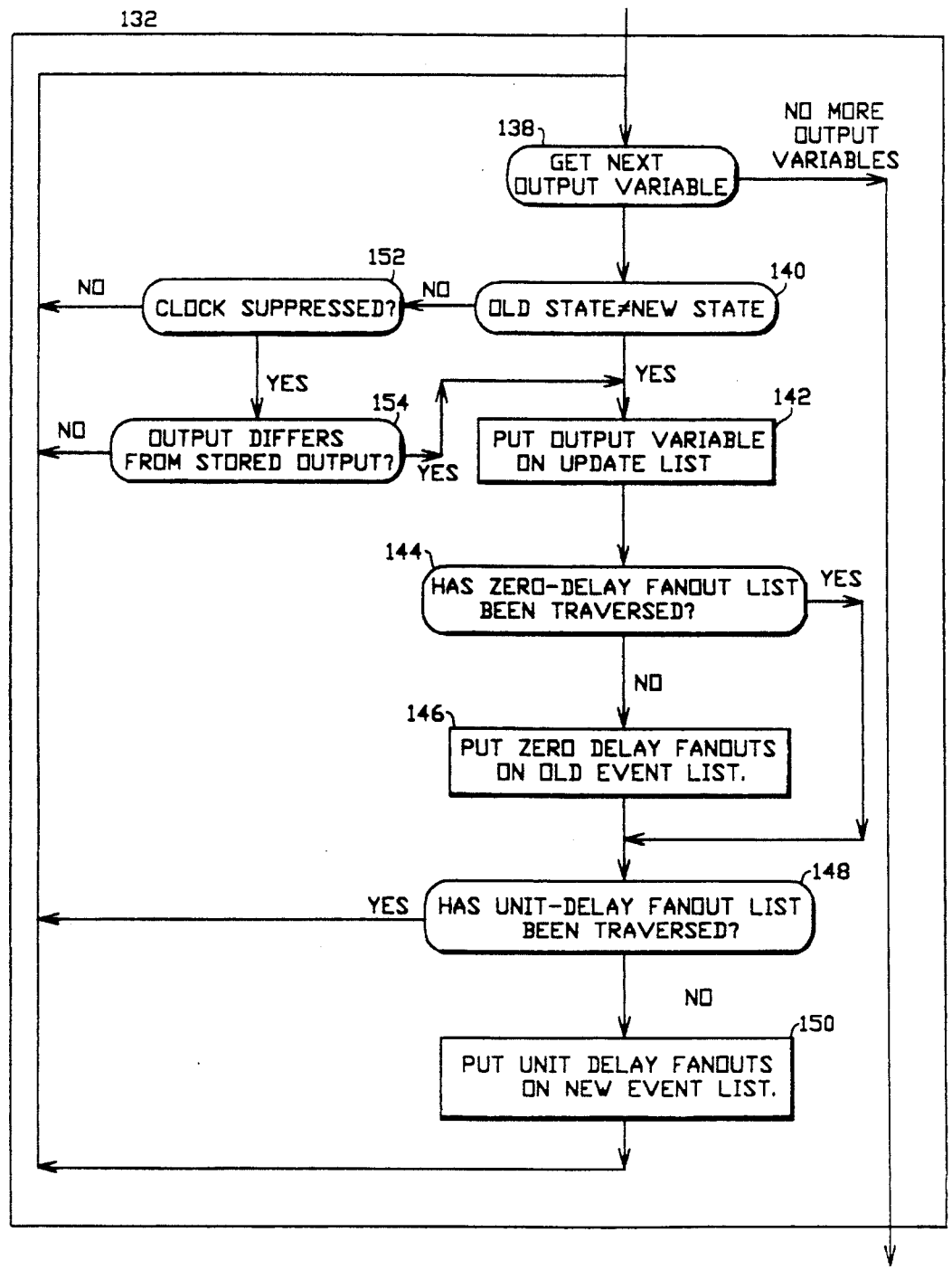

Referring to FIG. 22, depicting the SCS version of Schedule 132, after the old and new states are compared 140, if the old state is equal to the new state, then, if clock suppression is in effect 152, then check whether the output differs from the stored output 154. If not then get the next output variable 138, otherwise the output variable is put on the update list 142.

Figure 23:
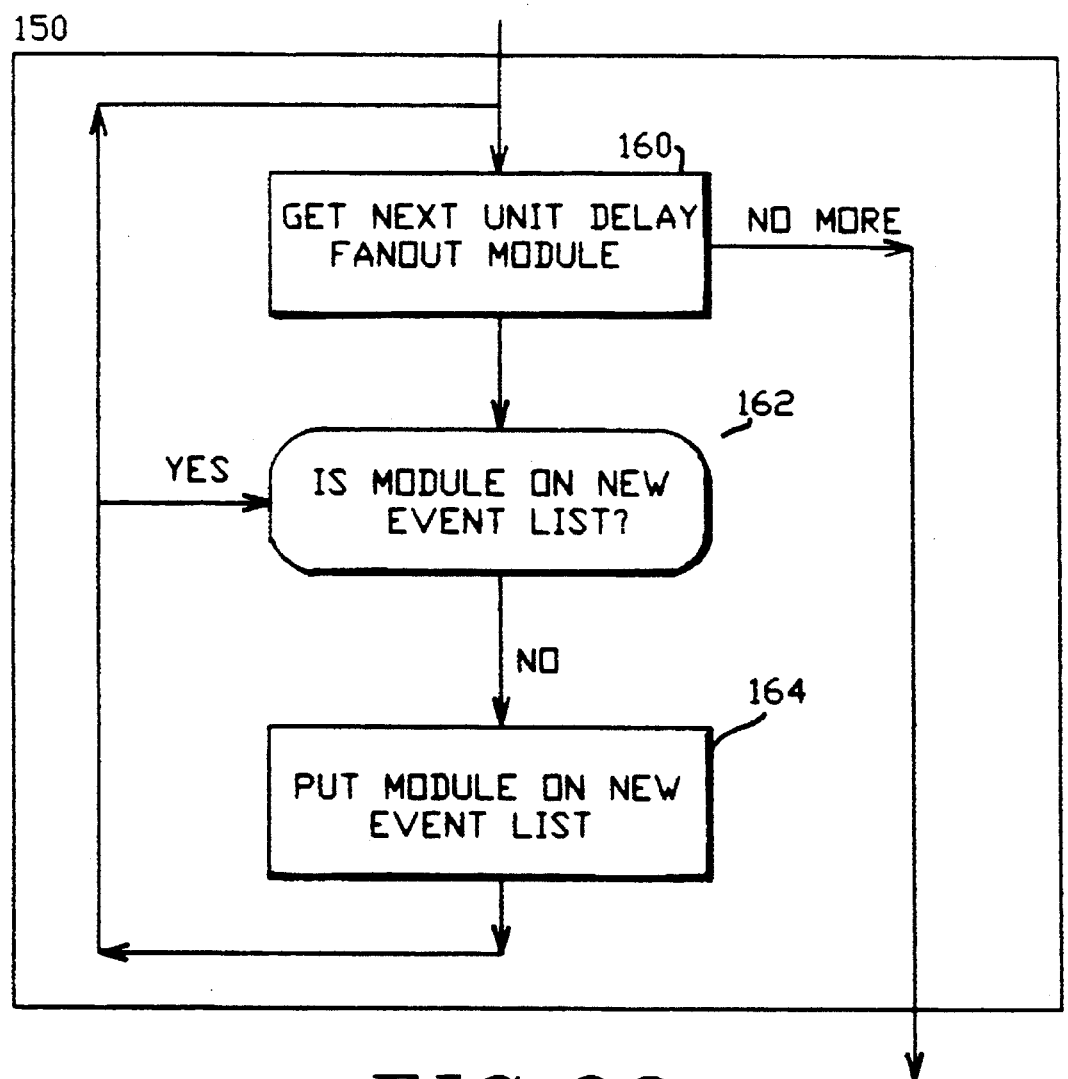
Figure 24:
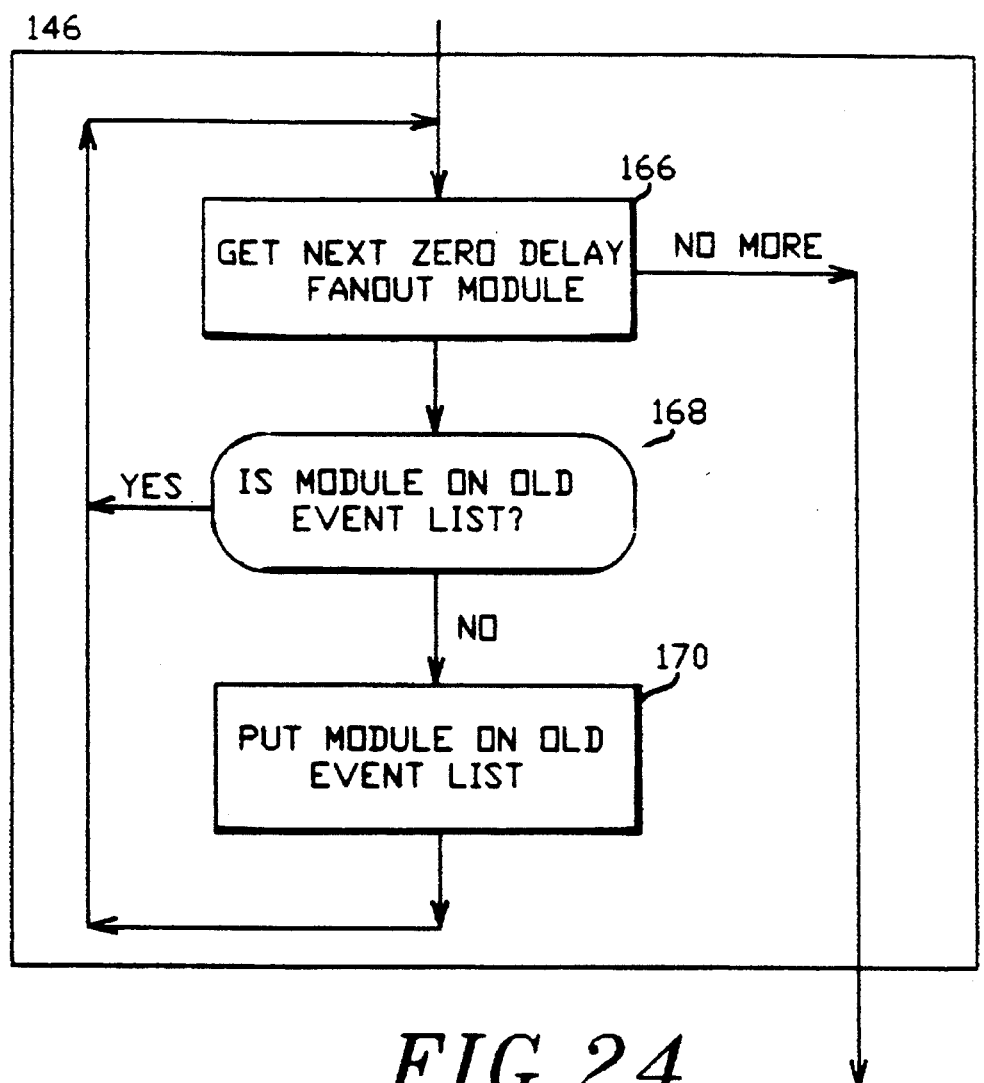

The SCS version of Schedule 132 requires two more changes. These are made in the steps which put the zero and unit delay fanouts on the respective event lists 146, 150. FIGS. 23 and 24 depict, in greater detail, the processes of putting the fanouts on the event lists in the non-SCS version. Referring to FIG. 23, step 150 gets the next unit delay fanout module. If there are no more such modules then processing continues with step 138 which gets the next output variable, otherwise, if the module is on the new event list 162, then the next module is obtained 160. If the module is not on the event list then it is put on the list 164 and the next module is obtained 160. Step 146, referring to FIG. 24, processes zero delay modules in a similar fashion. It gets the next zero-delay fanout module 166, checks whether it is on the old event list 168, and, if not, puts it on that event list 170. If it is on the old event list 168, then the process loops back to get the next zero-delay fanout module 166. If there are no more zero-delay fanout modules then processing continues by checking the unit-delay fanout list 148 in schedule 132.

Figure 25:
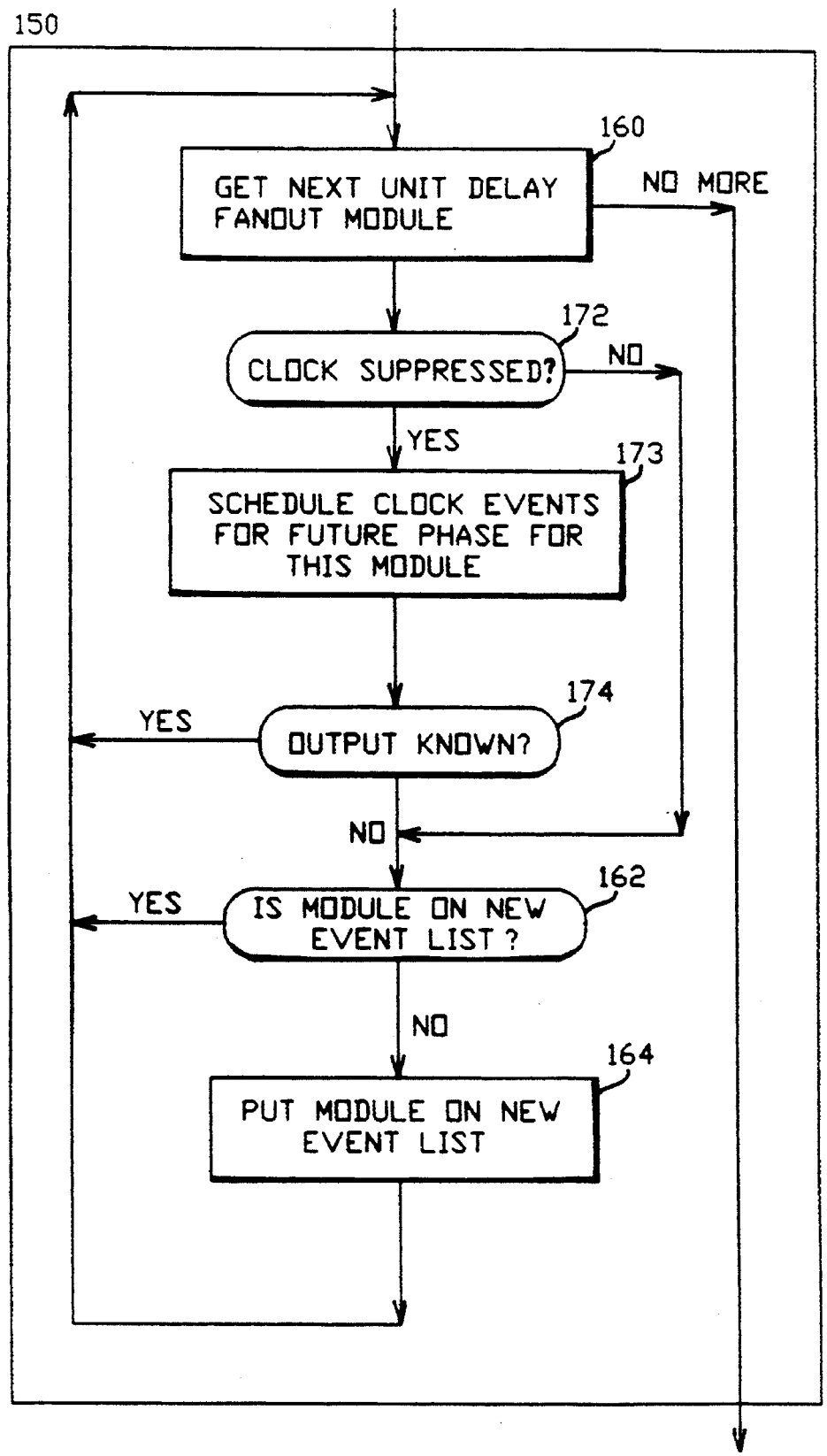
Figure 26:
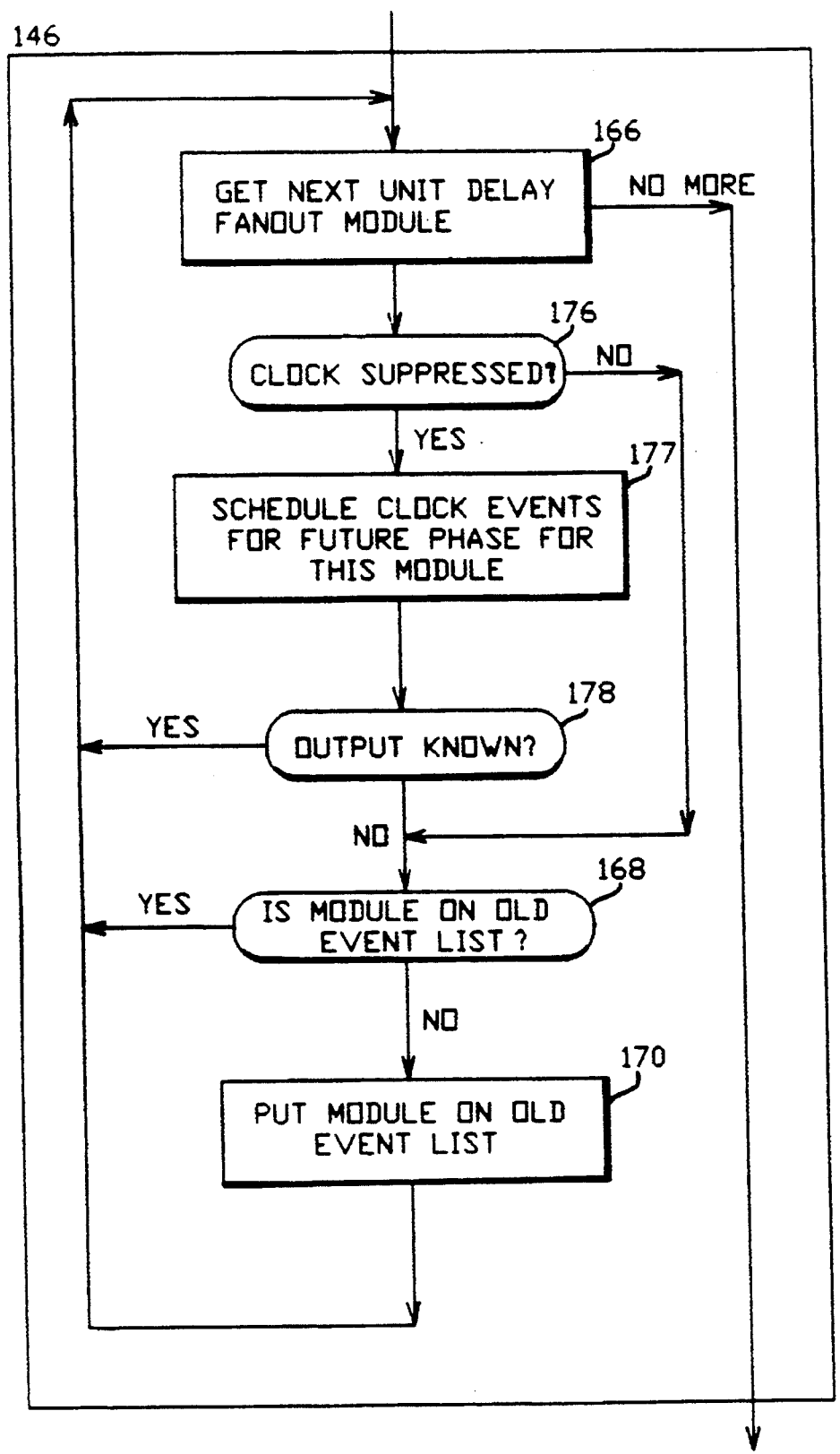

FIGS. 25 and 26 depict the SCS version of the steps which put the delay fanouts on the event lists 146, 150.

Referring to FIG. 25, the step to put the unit-delay fanouts on the new event list 150 is modified such that after the next unit-delay fanout module is obtained 160 a check is made to determine whether this node is clock suppressed 172. If not then processing continues with step 162 as described above for the non-SCS version, otherwise, schedule the clock events for future phases for this module 173, and then if the output is already known 174 then the module is not added to the new event list and the next module, if there is one, is obtained 160.

Similarly, referring to FIG. 26, adding the zero-delay fanouts to the old event list 146 is modified such that for each zero-delay fanout module, if "clock suppressed?" 176 then schedule the clock events for future phases for this module 177, and then, if the output is known 178, then that module is not added to the old event list 170, otherwise processing continues as in the non-SCS version (FIG. 24).

Since the conventional network simulator is used in the SCS algorithm, multiple evaluation within a phase is possible. Multiple evaluation of sequential modules within a phase must be handled carefully in augmented simulation. If a module such as M1 in FIG. 7 is evaluated multiple times, the first evaluation must use the old state from the previous phase as input, and all later evaluations must use the old state from the present phase. In our algorithm, we use some unit delay step information gathered in the presimulation step to predict in which unit-delay step the module is evaluated due to the clocks. After this unit-delay step, the present phase value is used as the old state for evaluation.

Figure 27:
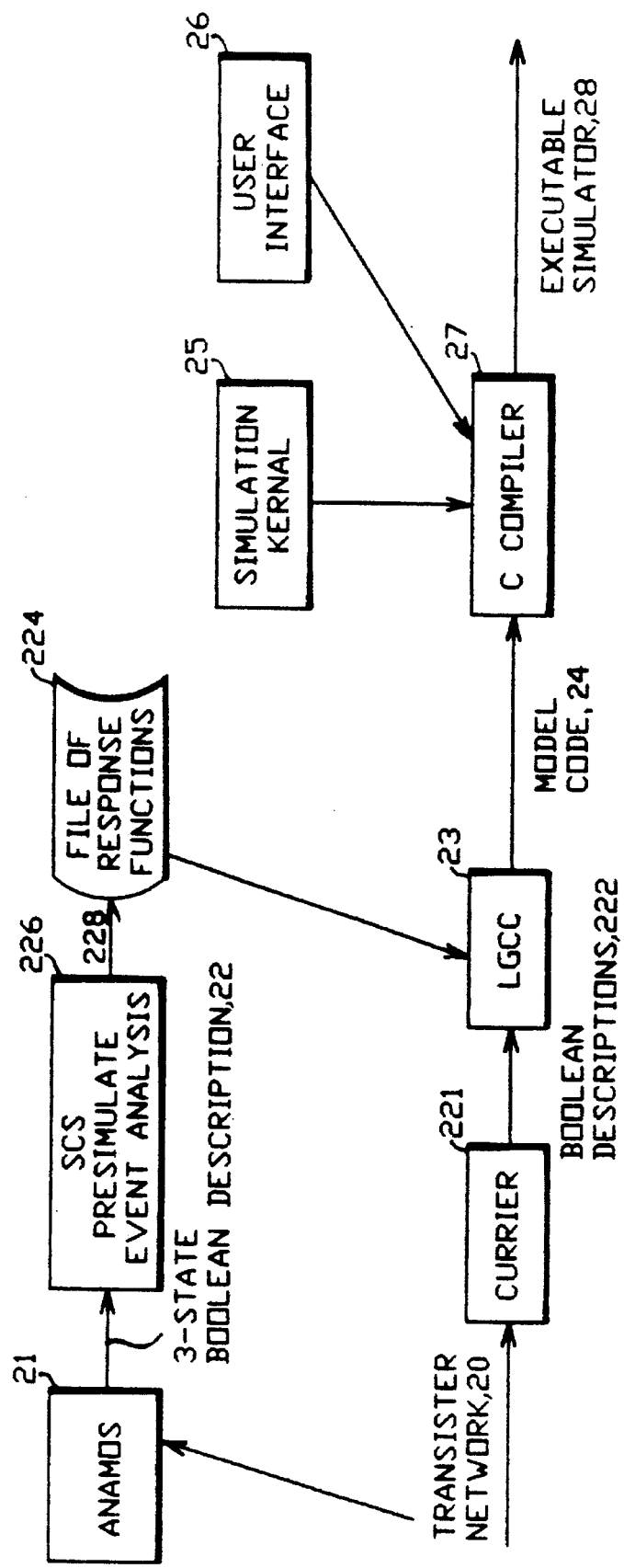
FIG. 27 depicts the use of CURRIER in optimistic model simulation.

In summary, referring to FIG. 27, SCS consists of the steps of:

preanalysis 180 of the simulation code and storing 182 phase waveforms representing the values occurring at a node in successive phases;

categorizing modules 184, based on the results of preanalysis 180, into a category for which an event-based evaluation is to be performed in each phase of the simulation, and a category for which no event-based evaluation need be performed in at least one but not all phases, then determining appropriate responses 186, for each phase of a second category module, to an event occurring with respect to the module, and then including 188 a data structure with the simulation code with entries for each module of the code for controlling the phases in which simulation code for evaluation of the module is not executed.

EXAMPLE

A complete simulation of the simple shifter example presented in FIG. 7 will illustrate the operation and power of the static clock suppression algorithm. FIG. 11 shows the phase-waveforms for the network after presimulation. The table that follows shows the phase by phase operation of the circuit, given a change in the S_in primary input signal. The right side of the table contains the information on module evaluation (Ev) and scheduling (S34). For example, S34 means that the module is scheduled to be evaluated in the next phases 3 and 4. In this example, ten evaluations are sufficient to completely simulate the response to the change in the S_in primary input signal. For normal event-driven simulation, the number of evaluations would be 6C+4, where C is the number of cycles of simulation.

| C.P | Sin | S1 | S2 | S3 | Sout | M1 | M2 | M3 | INV |
|---|---|---|---|---|---|---|---|---|---|
| 1.1 | X→0 | X | X | X | X | EV S34 | | | |
| 1.2 | 0 | X | X | X | X | | | | |
| 1.3 | 0 | X→1 | X | X | X | Ev | Ev S12 | | |
| 1.4 | 0 | 1 | X | X | X | Ev | | | |
| 2.1 | 0 | 1 | X→0 | X | X | | Ev | Ev S41 | |
| 2.2 | 0 | 1 | 0 | X | X | | Ev | | |
| 2.3 | 0 | 1 | 0 | X | X | | | | |
| 2.4 | 0 | 1 | 0 | X→1 | X→0 | | | Ev | Ev |
| 3.1 | 0 | 1 | 0 | 0 | 0 | | | Ev | |
| 3.2 | 0 | 1 | 0 | 0 | 0 | | | | |

-continued

| C.P | Sin | S1 | S2 | S3 | Sout | M1 | M2 | M3 | INV |
|-----|-----|----|----|----|------|----|----|----|-----|
| 3.3 | 0 | 1 | 0 | 0 | 0 | | | | |
| 3.4 | 0 | 1 | 0 | 0 | 0 | | | | |

SCS Results

The SCS algorithm, described herein, has been implemented in the COSMOS simulator. Since the SCS algorithm is event-directed at the phase-waveform level, care must be taken in the presentation of the results. For example, one could claim almost any speedup for the shifter test presented above, but the speedup would not be applicable in a realistic simulation environment.

OPTIMISTIC MODEL SIMULATION

The results obtained using SCS algorithm can be improved by reducing the complexity of the evaluation functions generated by ANAMOS. A large part of the complexity of these evaluation functions is generated in an attempt to model X-state and switch-level effects, such as charge sharing, correctly.

From a digital circuit design point of view, the X-state is important for two reasons:

1. Initialization: The X-state can be used to verify that the network can be placed in a stable state after powerup.
2. Invalid States: The X-state can indicate invalid states. This generally occurs due to unintended charge sharing or resistive conflict.

The initialization simulation generally has a short duration (1000–5000 cycles), but invalid states can occur any time during logic simulation. The duration for logic simulations can be quite large, so it would be useful to accelerate the simulation process to catch logical errors.

In order to accelerate logic simulation, a version of ANAMOS, called CURRIER, has been created which generates 2-state models that correctly model the 3-state behavior for resistive conflict, but do not model charge sharing.

CURRIER generates this model by using only 2-valued algebra for the indefinite and potential functions, and by stopping at the last resistive strength analysis portion of the ANAMOS algorithm. With this model, an X is generated when resistive conflict occurs, but the fanout modules convert the X to one. A fourth state, "star", the (0, 0) state, is generated when charge sharing occurs when a node retains its old state. (Recall that the ternary system used only the three states (0, 1), (1, 0), and (1, 1) for 0, 1, and X respectively.) The "star" state is modified in simulation kernel 25 to always assign the old state immediately after the module evaluation phase of the simulator. If charge sharing is used in the correct operation of a circuit, this model would give incorrect results. Fortunately, charge sharing is generally considered to be an undesired side effect, and its occurrence is considered to be an invalid condition.

Recall that the process of determining the evaluation functions consists of looking at an output node, and, for the highest level resistive strength, determining all paths to power and ground for this node. This provides a boolean evaluation function for that particular resistive strength. The same operation is then performed for the next (lower) resistive strength, in order to derive a boolean evaluation function that deals with all the boolean combinations that were left over, i.e., were not dealt with in the last resistive strength considered. This process continues for all resistive strengths. In the 2-state, non-capacitive model, the process stops before it gets to the capacitive strength, therefore there may be some combinations of inputs that are not accounted for. In these cases the value "star" is used to inform the simulation kernel that the system did not determine the values these nodes might have.

Whenever simulation kernel 25 (FIG. 2) encounters a "star" node, it makes the (optimistic) assumption that there is no charge sharing and it retains the old state that was on the node from the previous time, i.e., if a "star" is produced, then the simulator overwrites the "star" with the old state and the continues processing.

At first glance, it might seem that the SCS algorithm would fail on these 2-state models because of the heavy use of monotonicity related to the X state. But, observe that in the 3-state simulation, after initialization, the network is being simulated under 2-state conditions, which means that the 3-state SCS analysis must be sufficient for the 2-state simulation. Using this observation, the 2-state simulation strategy is (referring to FIG. 28):

1. Generate a 3-state model 22 using ANAMOS 21.
2. Generate the response functions 228 for the 3-state model using the SCS presimulation and event analysis algorithms 226.
3. Save the response functions 228 in a file 224.
4. Generate a 2-state model 222 using CURRIER 221.
5. Load the response functions 228 from the file 224 during presimulation 23.

Note that the response functions generated by the SCS algorithm are valid whether or not they are used with a 2 or 3-state model.

Recall that the response function determines at which phases the logic to which it corresponds is to be evaluated. In the 2-state model the actual evaluation function is reduced in complexity, but the response function remains the same.

The overall effect of this 2-state simulation is to provide faster simulation at the expense of catching invalid charge sharing conditions. Initialization can be performed with the 3-state model because the duration of the simulation is relatively short. Resistive conflict can still be caught after module evaluation because a local X is generated by the CURRIER models.

The performance of the optimistic model is substantially improved especially for a circuit that has a number of modules that contain large evaluation functions due to charge sharing considerations.

Other embodiments are within the following claims.

What is claimed is:

1. A method of preparing for executing simulation code for a logic circuit design having at least some elements which are synchronously clocked by multiple phase clock signals, the simulation code including data structures associated with circuit modules and nodes interconnecting the circuit modules, comprising, by computer performing a preanalysis of the simulation code and storing phase waveforms each representing values occurring at a node in successive phases, based on the preanalysis, categorizing modules in a first category for which an event-based evaluation is to be performed in each phase of the simulation, and a second category for which no event-based evaluation need be performed in at least one but not all phases, determining for each phase of a second category module, an appropriate response to an event occurring with respect to the module, and providing a data structure entry for each module of the code, said data structure entry indicative of the phases in which simulation code for evaluation of the module is not executed.

2. The method of claim 1 wherein the data structure entry comprises either an indication that the module belongs to the first category, or, with respect to a module of the second category, phase waveform information associated with said module.

3. Apparatus for preparing for executing simulation code for a logic circuit design having at least some elements which are synchronously clocked by multiple phase clock signals, the simulation code including data structures associated with circuit modules and nodes interconnecting the circuit modules, the simulation code also including process steps which schedule modules for evaluation in response to events which occur during the simulation, the method comprising, in the process of scheduling modules for evaluation, for each output variable of a module under evaluation for a phase, if its old state is the same as its new state, testing whether the old state of the output variable is different from a corresponding stored output value, and if so, scheduling clock events for later phase evaluations of the module.

4. A method of preparing for executing simulation code for a logic circuit design having at least some elements which are synchronously clocked by multiple phase clock signals, the simulation code including data structures associated with circuit modules and nodes interconnecting the circuit modules, the simulation code also including process steps which schedule modules for evaluation in response to events which occur during the simulation, the method comprising, in the process of scheduling modules for evaluation, for each output variable of a module under evaluation for a phase, if its old state is the same as its new state, testing whether the old state of the output variable is different from a corresponding stored output value, and if so, scheduling clock events for later phase evaluations of the module.

5. Apparatus for preparing for executing simulation code for a logic circuit design having at least some elements which are synchronously clocked by multiple phase clock signals, the simulation code including data structures associated with circuit modules and nodes interconnecting the circuit modules, the simulation code also including process steps which occur during the simulation, the apparatus comprising, means for use in the process of scheduling modules for evaluation, for each output variable of a module under evaluation for a phase, if its old state is the same as its new state, for testing whether the old state of the output variable is different from a corresponding stored output value, and means for responding to old state being different from the new state by scheduling clock events for later phase evaluations of the module.

6. A method of preparing for executing simulation code for a logic circuit design having at least some elements which are synchronously clocked by multiple phase clock signals, the simulation code including data structures associated with circuit modules and nodes interconnecting the circuit modules, each module having a fanout leading from its outputs to inputs of other module, the simulation code also including process steps which apply a fanout of a module under evaluation in a phase to the scheduling of future evaluations of modules the method comprising, in the process of applying a fanout to the scheduling of future evaluations, if the output of the module in the phase is already known, suppressing the scheduling of future evaluations with respect to that output.

7. The method of claim 6 wherein the applying of the fanout is with respect to scheduling of evaluations with a unit delay, and the scheduling of future evaluations is suppressed with respect to evaluations with a unit delay.

8. The method of claim 6 wherein the applying of the fanout is with respect to scheduling of evaluations with a zero delay, and the scheduling of future evaluations is suppressed with respect to evaluations with a zero delay.

* * * * *